(12) United States Patent
Huang et al.

(10) Patent No.: US 10,504,770 B2
(45) Date of Patent: Dec. 10, 2019

(54) FINFET STRUCTURE WITH DIFFERENT FIN HEIGHTS AND METHOD FOR FORMING THE SAME

(71) Applicant: Taiwan Semiconductor Manufacturing Company, Ltd., Hsinchu (TW)

(72) Inventors: Yu-Lien Huang, Jhubei (TW); Chi-Kang Liu, Taipei (TW); Chi-Wen Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/010,628

(22) Filed: Jun. 18, 2018

(65) Prior Publication Data

US 2018/0301339 A1 Oct. 18, 2018

Related U.S. Application Data

(63) Continuation of application No. 15/085,750, filed on Mar. 30, 2016, now Pat. No. 10,002,765, which is a
(Continued)

(51) Int. Cl.
*H01L 21/00* (2006.01)
*H01L 21/762* (2006.01)
(Continued)

(52) U.S. Cl.
CPC ...... *H01L 21/76224* (2013.01); *H01L 21/266* (2013.01); *H01L 21/30604* (2013.01);
(Continued)

(58) Field of Classification Search
None
See application file for complete search history.

(56) References Cited

U.S. PATENT DOCUMENTS

| 6,077,742 A | 6/2000 | Chen et al. |
| 7,612,405 B2 | 11/2009 | Yu et al. |

(Continued)

FOREIGN PATENT DOCUMENTS

| KR | 20080050441 A | 6/2008 |
| KR | 20110056225 A1 | 5/2011 |

(Continued)

*Primary Examiner* — Evren Seven
(74) *Attorney, Agent, or Firm* — Slater Matsil, LLP

(57) ABSTRACT

A method for forming FinFETs comprises forming a plurality of first fins and a plurality of second fins over a substrate and embedded in isolation regions, depositing a first photoresist layer over the substrate, removing the first photoresist layer over an n-type region, applying a first ion implantation process to the first isolation regions, wherein dopants with a first polarity type are implanted in the first isolation regions, depositing a second photoresist layer over the substrate, removing the second photoresist layer over a p-type region, applying a second ion implantation process to the second isolation regions, wherein dopants with a second polarity type are implanted in the second isolation regions, applying an annealing process to the isolation regions and recessing the first isolation regions and the second isolation regions through an etching process.

20 Claims, 26 Drawing Sheets

Related U.S. Application Data continuation of application No. 13/778,261, filed on Feb. 27, 2013, now Pat. No. 9,318,367.

(51) Int. Cl.
| | | |
|---|---|---|
| *H01L 27/092* | (2006.01) | |
| *H01L 21/8238* | (2006.01) | |
| *H01L 21/8234* | (2006.01) | |
| *H01L 21/266* | (2006.01) | |
| *H01L 21/306* | (2006.01) | |
| *H01L 21/324* | (2006.01) | |

(52) U.S. Cl.
CPC .... *H01L 21/324* (2013.01); *H01L 21/823412* (2013.01); *H01L 21/823418* (2013.01); *H01L 21/823431* (2013.01); *H01L 21/823807* (2013.01); *H01L 21/823814* (2013.01); *H01L 21/823821* (2013.01); *H01L 27/0924* (2013.01)

(56) References Cited

U.S. PATENT DOCUMENTS

| | | | |
|---|---|---|---|
| 7,719,059 | B2 | 5/2010 | Hofmann et al. |
| 8,476,137 | B1 | 7/2013 | LiCausi et al. |
| 9,318,367 | B2* | 4/2016 | Huang ................ H01L 27/0924 |
| 9,418,994 | B1* | 8/2016 | Chao ................... H01L 27/0886 |
| 9,496,178 | B2 | 11/2016 | Zhu et al. |
| 9,905,467 | B2* | 2/2018 | Li ................... H01L 21/823431 |
| 2007/0257319 | A1 | 11/2007 | Xiong et al. |
| 2008/0265338 | A1 | 10/2008 | Yu et al. |
| 2009/0042401 | A1 | 2/2009 | Sinha et al. |
| 2009/0090976 | A1 | 4/2009 | Kavalieros et al. |
| 2009/0321834 | A1 | 12/2009 | Rachmady et al. |
| 2010/0276756 | A1 | 11/2010 | Rachmady et al. |
| 2011/0073919 | A1 | 3/2011 | Pawlak |
| 2011/0121406 | A1 | 5/2011 | Lee et al. |
| 2011/0127610 | A1 | 6/2011 | Lee et al. |
| 2011/0169085 | A1 | 7/2011 | Xu et al. |
| 2013/0069112 | A1 | 3/2013 | Zhu et al. |
| 2014/0306317 | A1* | 10/2014 | Licausi ............. H01L 21/30625 257/506 |

FOREIGN PATENT DOCUMENTS

| | | |
|---|---|---|
| TW | 201010002 A | 3/2010 |
| TW | 201133792 A | 10/2011 |
| WO | 2007120293 A2 | 10/2007 |

\* cited by examiner

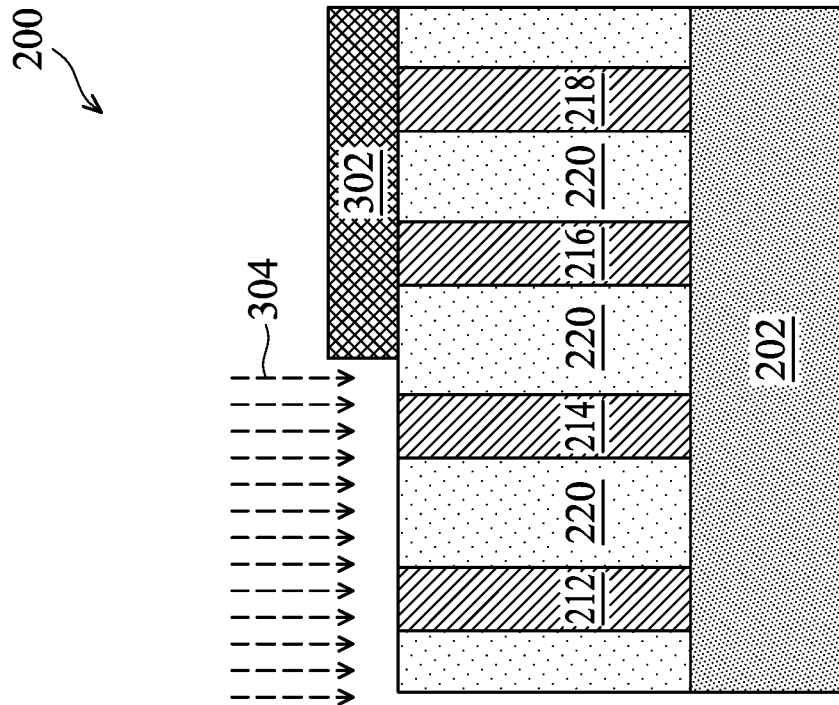
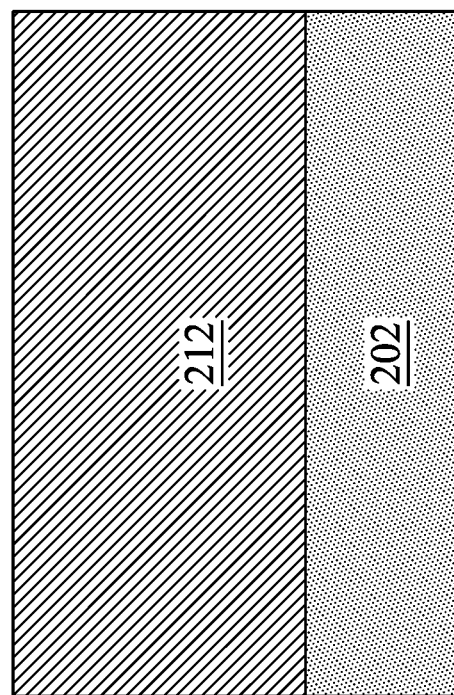
FIG. 3B
FIG. 3A

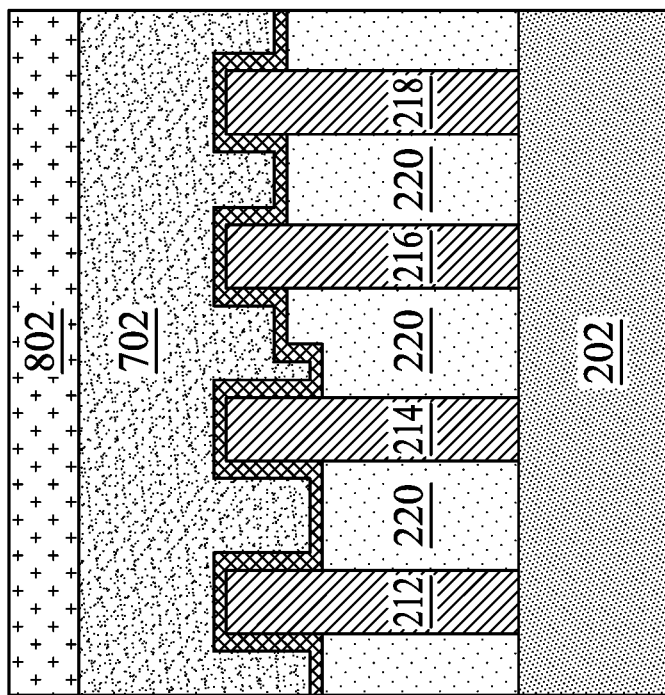
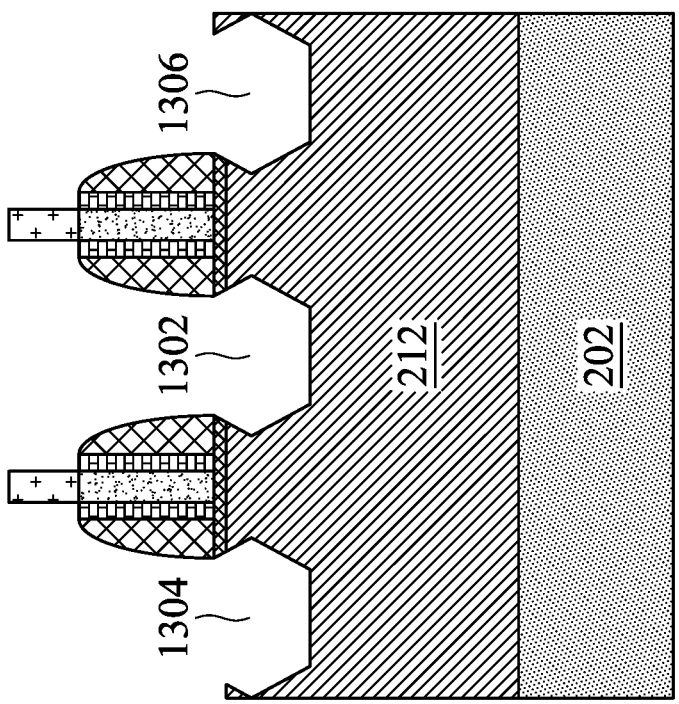
FIG. 13B
FIG. 13A

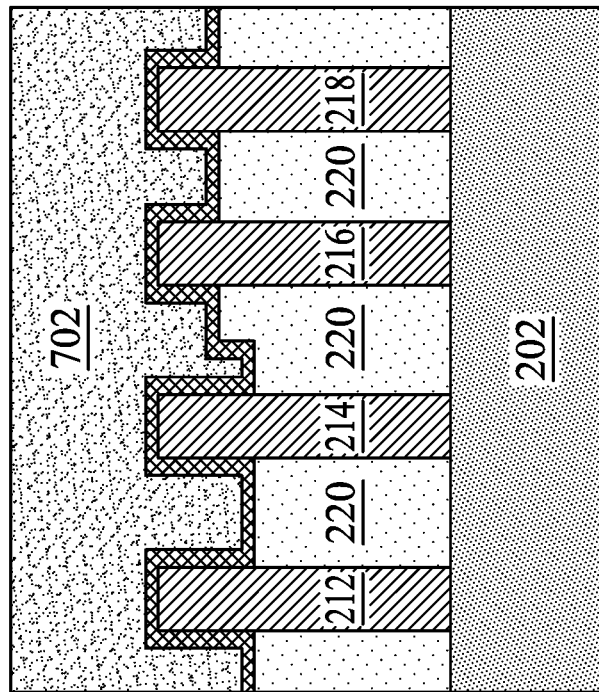
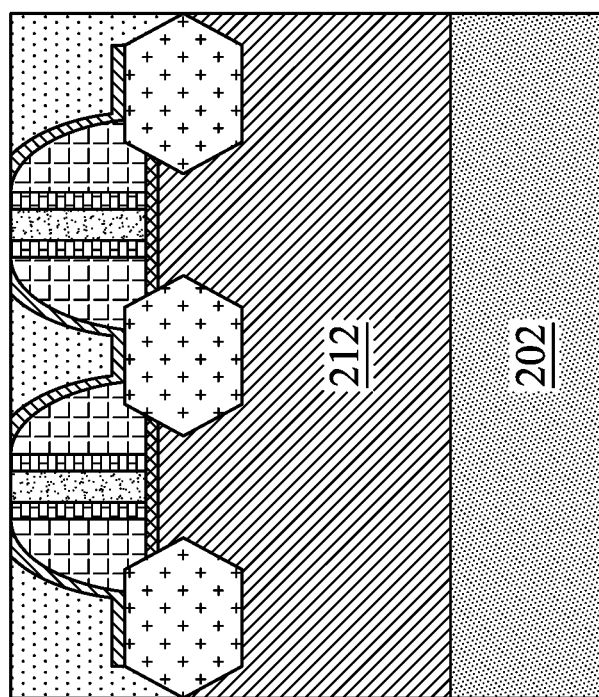
FIG. 21A
FIG. 21B

FINFET STRUCTURE WITH DIFFERENT FIN HEIGHTS AND METHOD FOR FORMING THE SAME

This application is a continuation of U.S. patent application Ser. No. 15/085,750 entitled, "FinFET Structure with Different Fin Heights and Method for Forming the Same," filed Mar. 30, 2016 which application is a continuation of U.S. patent application Ser. No. 13/778,261 entitled "FinFET Structure with Different Fin Heights and Method for Forming the Same," filed on Feb. 27, 2013, now U.S. Pat. No. 9,318,367 issued on Apr. 19, 2016, which applications are incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

In a complementary metal oxide semiconductor (CMOS) field effect transistor (FET), active regions include a drain, a source, a channel region connected between the drain and the source, and a gate on top of the channel to control the on and off state of the channel region. When the gate voltage is more than a threshold voltage, a conductive channel is established between the drain and the source. As a result, electrons or holes are allowed to move between the drain and source. On the other hand, when the gate voltage is less than the threshold voltage, ideally, the channel is cut off and there are no electrons or holes flowing between the drain and the source. However, as semiconductor devices keep shrinking, due to the short channel leakage effect, the gate cannot fully control the channel region, especially the portion of the channel region which is far away from the gate. As a consequence, after semiconductor devices are scaled into deep sub-30 nanometer dimensions, the corresponding short gate length of conventional planar transistors may lead to the inability of the gate to substantially turn off the channel region.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross sectional view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

The formation of fins of a FinFET may include recessing a substrate to form recesses, filling the recesses with a dielectric material, performing a chemical mechanical polish process to remove excess portions of the dielectric material above the fins, and recessing a top layer of the dielectric material, so that the remaining portions of the dielectric material in the recesses form shallow trench isolation (STI) regions.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A-25B are cross-sectional views of intermediate stages in the manufacturing of a fin field effect transistor (FinFET) in accordance with various embodiments of the present disclosure.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a fin field effect transistor (FinFET) semiconductor device having a plurality of p-type metal oxide semiconductor (PMOS) transistors and a plurality of n-type metal oxide semiconductor (NMOS) transistors, wherein the PMOS transistors and the NMOS transistors are of different fin heights. The invention may also be applied, however, to a variety of semiconductor devices. Hereinafter, various embodiments will be explained in detail with reference to the accompanying drawings.

Figure 1:
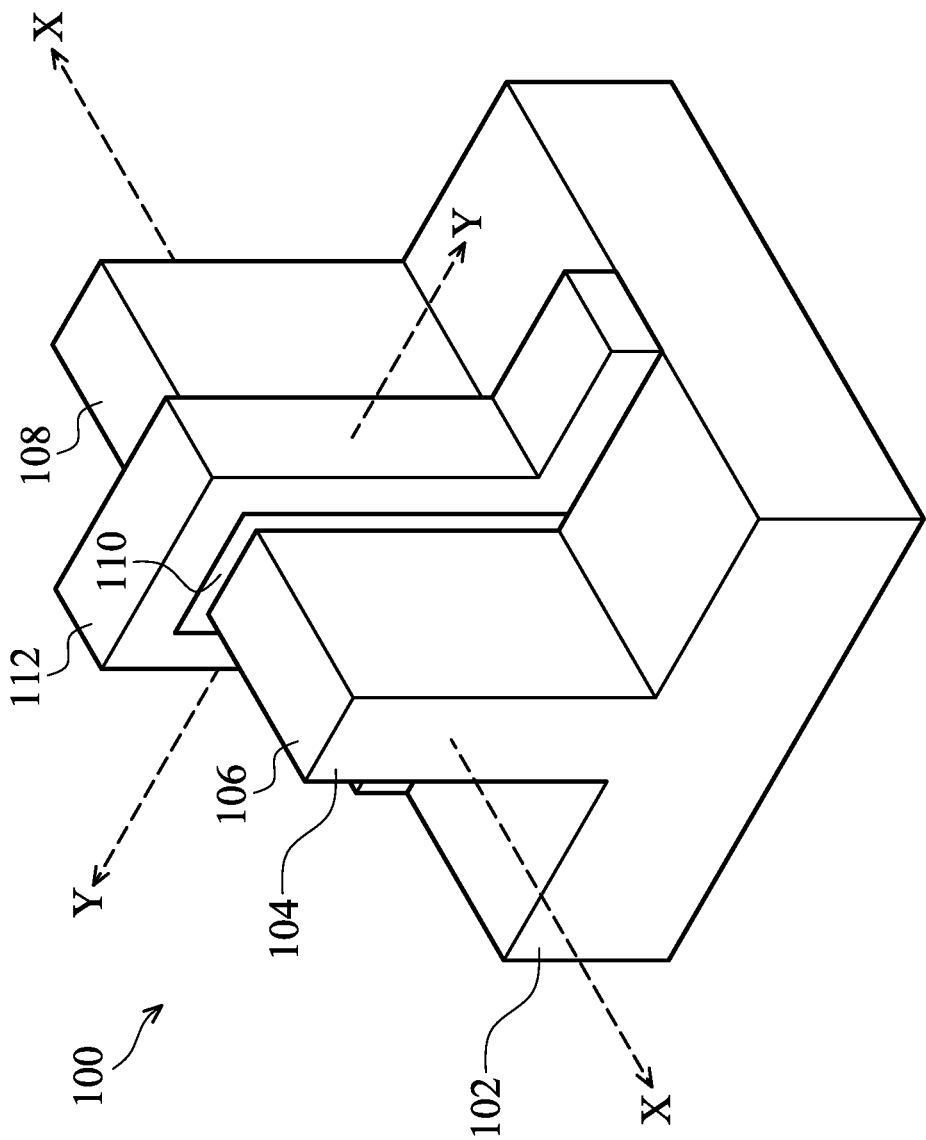
FIG. 1 illustrates a three-dimensional view of a FinFET in accordance with various embodiments of the present disclosure.

FIG. 1 illustrates a three-dimensional view of a FinFET in accordance with various embodiments of the present disclosure. The FinFET 100 comprises a fin 104 on a substrate 102. A gate dielectric layer 110 wraps the fin 104 around three sides like an upside-down U. A gate electrode 112 is formed over the gate dielectric layer 110.

The fin 104 comprises a first drain/source region 106, a second drain/source region 108 and a channel region coupled between the first drain/source region 106 and the second drain/source region 108. As shown in FIG. 1, the first drain/source region 106 and the second drain/source region 108 are disposed in opposite sides of the fin 104 with respect to the gate dielectric layer 110 and the gate electrode 112.

The gate dielectric layer 110 may be formed of oxide materials and formed by suitable oxidation processes such as wet or dry thermal oxidation, sputtering or by chemical vapor deposition (CVD) techniques using tetra-ethyl-ortho-silicate (TEOS) and oxygen as a precursor. In addition, the gate dielectric layer 110 may be a high-K dielectric material (K>10), such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof and/or the like.

The gate electrode 112 may comprise a conductive material selected from a group comprising of polycrystalline-silicon, poly-crystalline silicon-germanium, metal materials, metal silicide materials, metal nitride materials, metal oxide materials and the like. For example, metal materials may include tantalum, titanium, molybdenum, tungsten, platinum, aluminum, hafnium, ruthenium, a combination thereof and the like. Metal silicide materials include titanium silicide, cobalt silicide, nickel silicide, tantalum silicide, a combination thereof and the like. Metal nitride materials include titanium nitride, tantalum nitride, tungsten nitride, a combination thereof and the like. Metal oxide materials include ruthenium oxide, indium tin oxide, a combination thereof and the like.

The gate electrode 112 may formed by suitable fabrication processes such as CVD, physical vapor deposition (PVD), plasma enhanced CVD (PECVD), atmospheric pressure CVD (APCVD), high density plasma CVD (HD CVD), low-pressure chemical vapor deposition (LPCVD), atomic layer deposition (ALD) and/or the like.

FIG. 1 further illustrates two cross section lines that are used in FIGS. 2A-25B. A first cross section line X-X is along a longitudinal axis of the fin 104 and in a direction of, for example, a current, which flows between the first drain/source region 106 and the second drain/source region 108. A second cross section line Y-Y is perpendicular to the first cross-section line X-X and is across the channel region, the gate dielectric layer 110 and the gate electrode 112 of the FinFET 100.

FIGS. 2A-25B are cross-sectional views of intermediate stages in the manufacturing of a FinFET in accordance with various embodiments of the present disclosure. In FIGS. 2A through 25B, figures ending with an "A" designation are taken along the first cross section line X-X shown in FIG. 1. Figures ending with a "B" designation are taken along the second cross section line Y-Y.

Figure 2B:
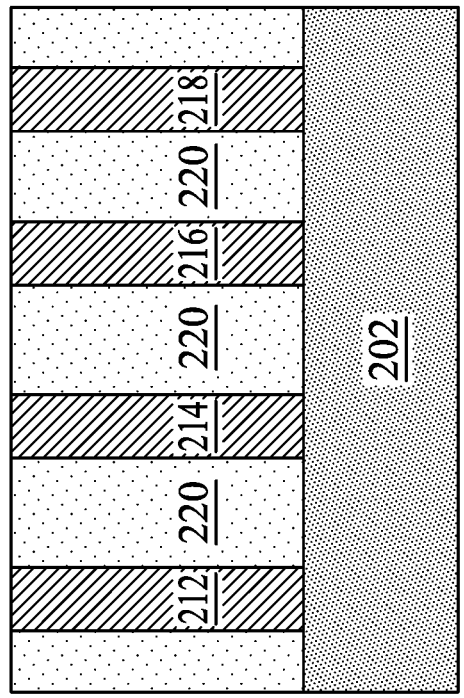
Figure 2A:
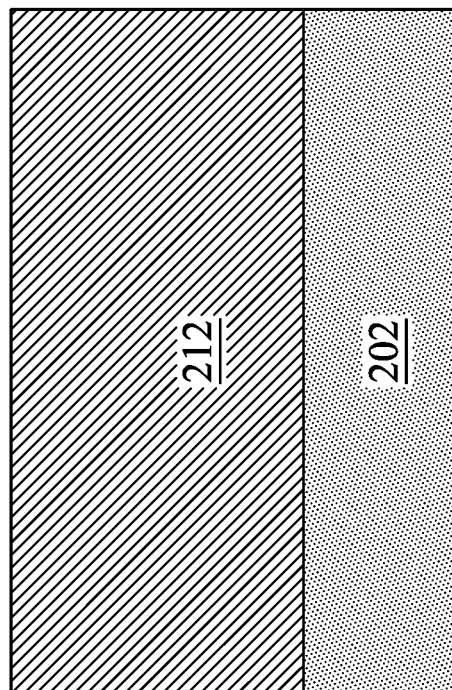

FIG. 2A and FIG. 2B illustrate cross sectional views of a semiconductor device including four fins in accordance with various embodiments of the present disclosure. The semiconductor device 200 includes four FinFETs, which are formed in a first fin 212, a second fin 214, a third fin 216 and a fourth fin 218 respectively. Fins 212, 214, 216 and 218 are formed over a substrate 202. In some embodiments, the FinFETs formed in the first fin 212 and the second fin 214 are NMOS transistors. On the other hand, the FinFETs formed in the third fin 216 and the fourth fin 218 are PMOS transistors. Throughout the description, the portion of the semiconductor device 200 including fins 212 and 214 is alternatively referred to as the NMOS portion of the semiconductor device 200. Likewise, the portion of the semiconductor device 200 including fins 216 and 218 is alternatively referred to as the PMOS portion of the semiconductor device 200.

It should be noted that while FIG. 2B shows the semiconductor device 200 includes four fins (e.g., fins 212, 214, 216 and 218), this is merely an example. One skilled in the art will recognize there may be many modifications, alternatives and variations. For example, the semiconductor device 200 may accommodate any number of fins depending on different applications and design needs.

The substrate 202 may be formed of silicon. Other commonly used materials, such as carbon, germanium, gallium, arsenic, nitrogen, indium, and/or phosphorus, and the like, may also be included in the substrate 202. The substrate 202 may be a bulk substrate or a semiconductor-on-insulator (SOI) substrate.

As shown in FIG. 2B, the fins 212, 214, 216 and 218 are enclosed by an isolation region 220. The isolation region 220 may be implemented by a shallow trench isolation (STI) structure. The STI structure (e.g., isolation region 220) may be fabricated by using suitable techniques including photolithography and etching processes. In particular, the photolithography and etching processes may comprise depositing a commonly used mask material such as photoresist over the substrate 202, exposing the mask material to a pattern, etching the substrate 202 in accordance with the pattern. In this manner, a plurality of openings may be formed as a result.

The openings are then filled with dielectric materials to form the STI structures (e.g., isolation regions 220). In accordance with an embodiment, the isolation regions may be filled with a dielectric material such as an oxide material, a high-density plasma (HDP) oxide or the like. Alternatively, the dielectric material may be formed of materials selected from the group consisting of silicon oxide, silicon nitride, silicon carbon nitride, silicon oxy-carbon nitride and any combinations thereof. The dielectric material may be deposited through suitable deposition techniques such as CVD, sub-atmospheric CVD (SACVD), high density plasma CVD (HDPCVD) and/or the like A chemical mechanical polishing (CMP) process is then applied to the portion of the dielectric material over the fins. As a result, excess portions of the dielectric material have been removed as shown in FIG. 2B. The remaining portions of the dielectric material are the isolation region 220.

As shown in FIG. 2B, the isolation region 220 may be portions of a continuous region, which may form an isolation ring in accordance with an embodiment. Alternatively, the isolation region 220 may be two separate isolation regions having their sidewalls facing each other.

FIG. 3A and FIG. 3B illustrate cross sectional views of the semiconductor device shown in FIG. 2A and FIG. 2B after a photoresist layer is deposited over the PMOS portion of the semiconductor device and a p-type implantation process is applied to the NMOS portion of the semiconductor device in accordance with various embodiments of the present disclosure. The photoresist layer 302 is deposited over the fins 216 and 218 of the semiconductor device 200. In other words, the PMOS portion of the semiconductor device 200 is covered by the photoresist layer 302.

The photoresist layer 302 is formed of suitable photoresist materials such as polybenzoxazole (PBO), SU-8 photosensitive epoxy, film type polymer materials and/or the like. The photoresist layer 302 may be formed by suitable fabrication techniques such as spin coating and/or the like.

As shown in FIG. 3B, p-type dopants 304 are implanted into the isolation regions 220 of the NMOS portion of the semiconductor device 200. The p-type dopants 304 include boron, BF2 and/or the like. The dosage of the p-type dopants 304 in the isolation region 220 is approximately equal to $10^{13}$ cm$^{-2}$. The boron ion implantation may be at an energy level of 140 KV. In other words, the concentration of p-type dopants is equal to or less than $10^{18}$ cm$^{-3}$.

After the p-type dopants 304 have been implanted into the NMOS portion of the semiconductor device 200, the photoresist layer 302 may be removed by suitable techniques such as an ashing process.

Figure 4B:
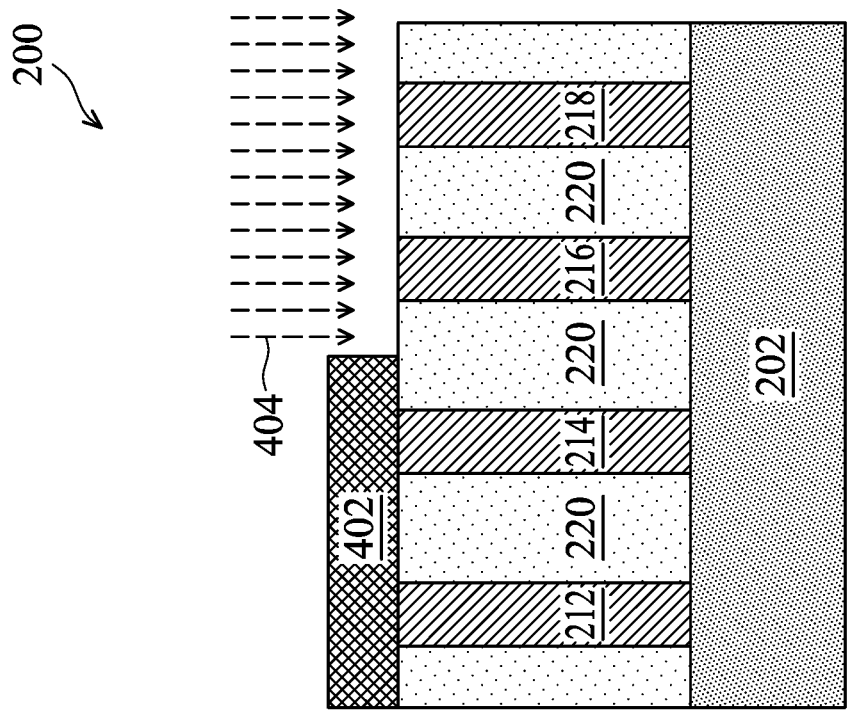
Figure 4A:
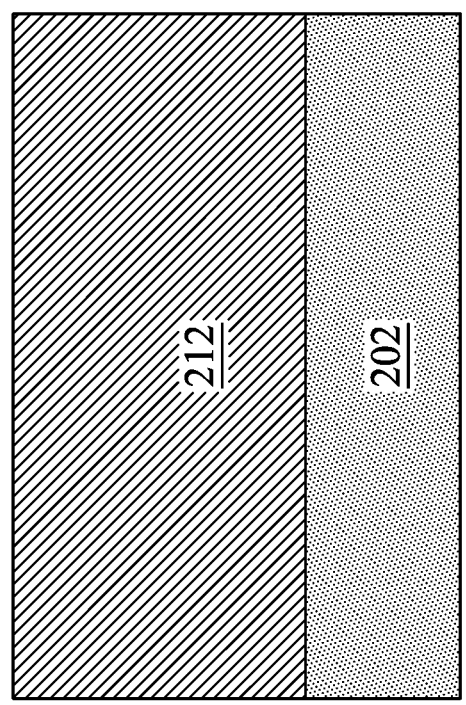

FIG. 4A and FIG. 4B illustrate cross sectional views of the semiconductor device shown in FIG. 3A and FIG. 3B after a photoresist layer is deposited over the NMOS portion of the semiconductor device and an n-type implantation process is performed on the PMOS portion of the semiconductor device in accordance with various embodiments of the present disclosure. The photoresist layer 402 is similar to the photoresist layer 302 shown in FIG. 3B. As shown in FIG. 4B, n-type dopants 404 are implanted into the isolation regions 220 of the PMOS portion of the semiconductor device 200. The n-type dopants 404 include phosphorus, arsenic and/or the like. The dosage of the n-type dopants 404 in the isolation regions 220 of the PMOS portion is approximately equal to $10^{13}$ cm$^{-2}$. The phosphorus ion implantation may be at an energy level of 10 KV. In other words, the concentration of n-type dopants is equal to or less than $10^{18}$ cm$^{-3}$.

One advantageous feature of implanting dopants into the isolation regions 220 of the NMOS portion and the PMOS portion of the semiconductor device 200 as shown in FIG. 3B and FIG. 4B respectively is that the etching rate of the isolation regions (e.g., isolation regions 220) will change after the dopants has been implanted into the isolation regions. In some embodiments, isolation regions implanted with p-type dopants is of an etching rate higher than isolation regions implanted with n-type dopants.

In some embodiments, when a wet etching process is applied to isolation regions (NMOS portion isolation regions implanted with p-type dopants as shown in FIG. 3B and PMOS portion isolation regions implanted with n-type dopants as shown in FIG. 4B), the etching rate for isolation regions implanted with n-type dopants is about 34.7 Angstroms per minute. On the other hand, the etching rate for isolation regions implanted with p-type dopants is about 52.8 Angstroms per minute. Such an etching rate difference may help to achieve different fin heights during an isolation recess process. The isolation recess process will be described below with respect to FIG. 5B.

After the implantation steps shown in FIGS. 3B and 4B, an annealing process may be performed to increase the implantation depth of the n-type dopants and p-type dopants. The annealing process may be a rapid thermal annealing (RTA) process, a millisecond annealing (MSA) process, a laser annealing process and/or the like.

In some embodiments, the annealing temperature is in a range from about 600 degrees to about 1300 degrees. For example, an RTA process is applied to the isolation regions 220. The annealing temperature is about 1000 degrees. The annealing process takes about 10 seconds.

It should be noted while FIG. 3B and FIG. 4B show a p-type implantation process is applied to the semiconductor device 200 prior to an n-type implantation process, one skilled in the art will recognize this is merely an example. There may be many alternatives, modifications and variations. For example, the n-type implantation process may be applied to the semiconductor device 200 prior to the p-type implantation process.

Figure 5B:
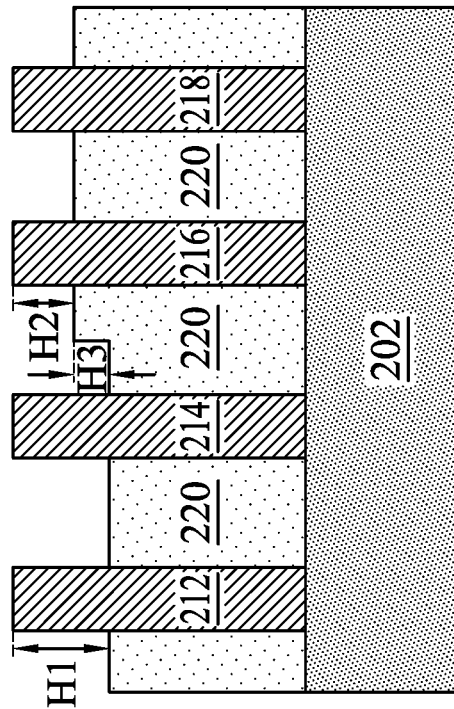
Figure 5A:
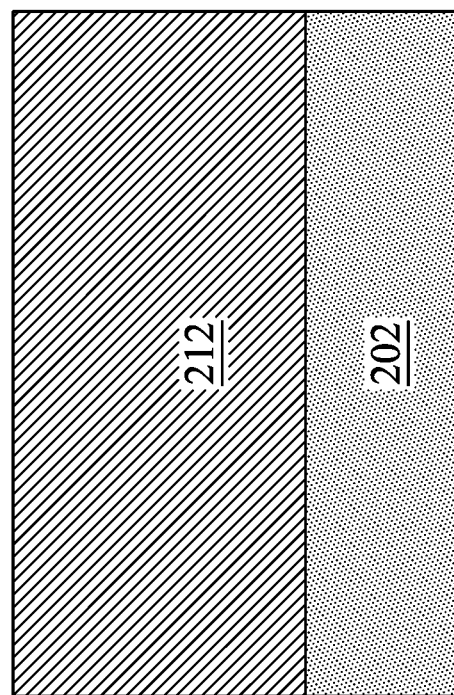

FIG. 5A and FIG. 5B illustrate cross sectional views of the semiconductor device shown in FIG. 4A and FIG. 4B after an etching process are applied to the semiconductor device in accordance with various embodiments of the present disclosure. The isolation regions 220 are recessed such that respective fins 212, 214, 216 and 218 may protrude over the top surfaces of the isolation regions 220. The isolation regions 220 may be recessed using a suitable etching process, such as one that is selective to the material of the isolation regions 220. For example, a chemical oxide removal (COR) using a Tokyo Electron CERTAS, an Applied Material SICONI tool and/or the like may be used. Alternatively, suitable wet etching processes such as dilute hydrofluoric (dHF) acid may be used.

In some embodiments, the pressure of the COR process is about 160 millitorr. The process recipe includes HF gas, NH3 gas and Argon gas. In alternative embodiments, a wet etching process is employed. The dHF acid is a mixture of HF and water (1:100). The wet etching process takes about 30 seconds.

The height of the exposed fins of the NMOS transistors (e.g., fin 212) and the height the exposed fins of the PMOS transistors (e.g. fin 216) may vary depending on different deign needs and applications. In some embodiments, as shown in FIG. 5B, the exposed fin (e.g., fin 212) of the NMOS transistors is higher than the exposed fin (e.g. fin 216) of the PMOS transistors. In other words, as shown in FIG. 5B, H1 (the height of fin 212) is greater than H2 (the height of fin 216). The difference between H1 and H2 is defined as H3. In some embodiments, H3 is greater than or equal to 2 nm.

One advantageous feature of having different fin heights for NMOS transistors and PMOS transistor is that the threshold voltages of the NMOS transistors and the PMOS transistors may be tuned through adjusting the fin heights of the NMOS transistors and the PMOS transistors.

Another advantageous feature of the fabrication step shown in FIG. 5B is that the fin height difference (e.g., H3) can be achieved through a single etching step. Such a single etching step to achieve different fin heights as shown in FIG. 5B helps to further reduce the cost of fabricating FinFETs.

Figure 6B:
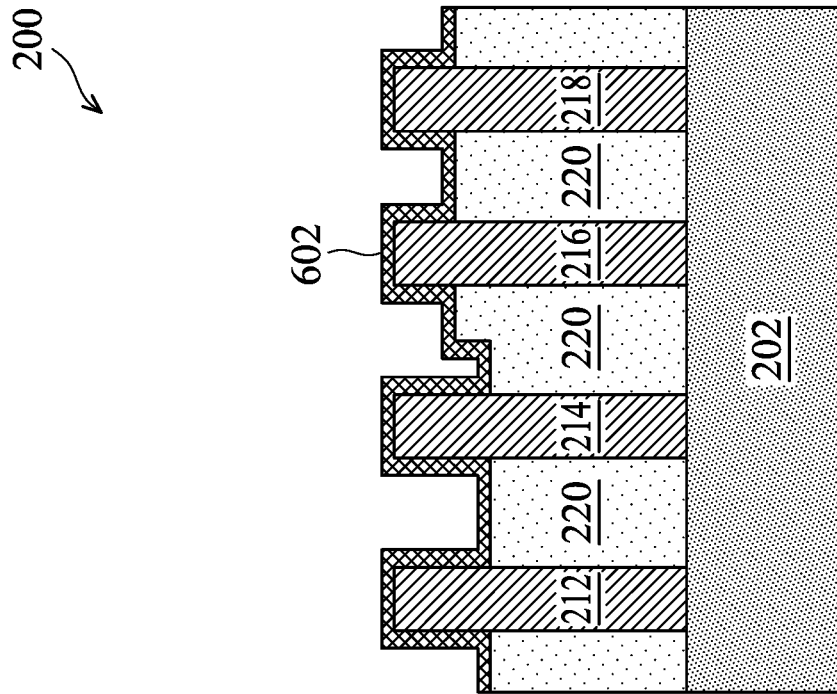
Figure 6A:
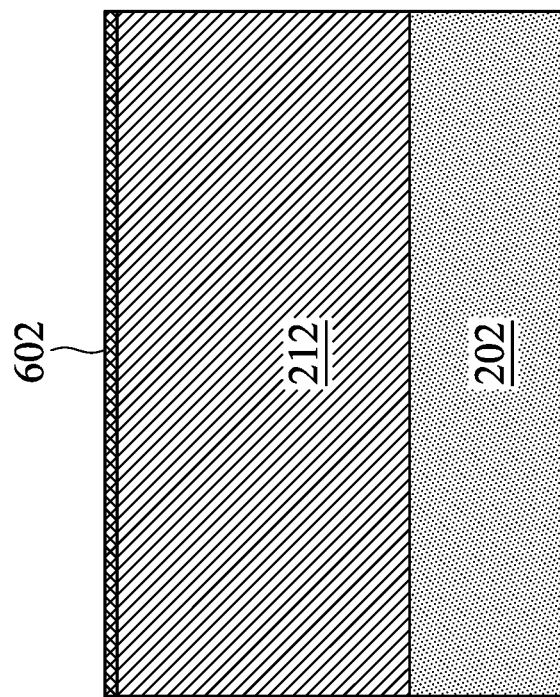

FIG. 6A and FIG. 6B illustrate cross sectional views of the semiconductor device shown in FIG. 5A and FIG. 5B after a dummy gate dielectric layer is formed over the semiconductor device in accordance with various embodiments of the present disclosure. The dummy gate dielectric layer 602 is formed on the fins 212, 214, 216 and 218. The dummy gate dielectric layer 602 may be formed of silicon oxide, silicon nitride, a combination thereof, or the like. The dummy gate dielectric layer 602 may be deposited or thermally grown according to acceptable techniques.

Figure 7B:
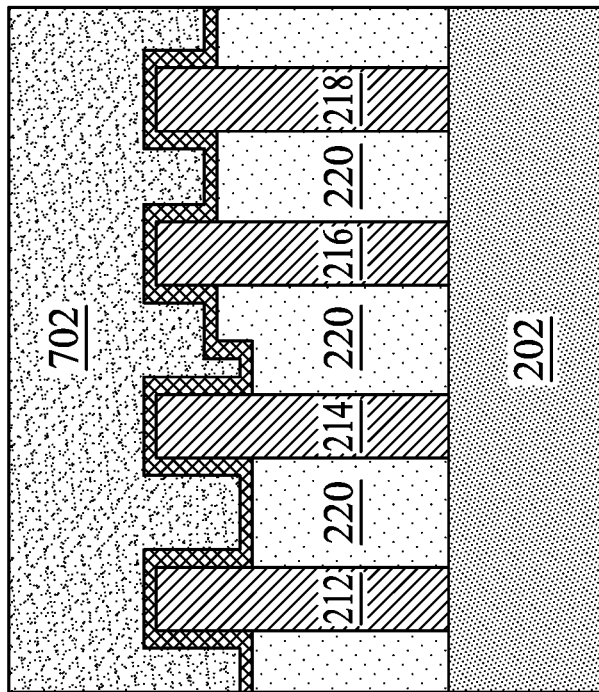
Figure 7A:
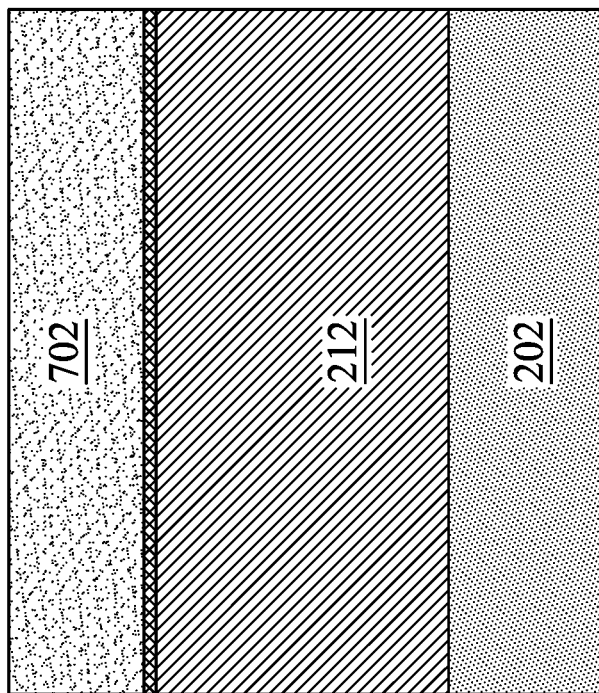

FIG. 7A and FIG. 7B illustrate cross sectional views of the semiconductor device shown in FIG. 6A and FIG. 6B after a dummy gate electrode is formed over the dummy gate dielectric layer in accordance with various embodiments of the present disclosure. The dummy gate electrode 702 may be formed of suitable gate electrode materials such as polysilicon, although other materials that have a high etching selectivity from the etching of isolation regions 220 may also be used. A chemical mechanical polishing process may be applied to the portion of the dummy gate electrode 702. As a result, a flat gate electrode is obtained as shown in FIG. 7A and FIG. 7B.

Figure 8B:
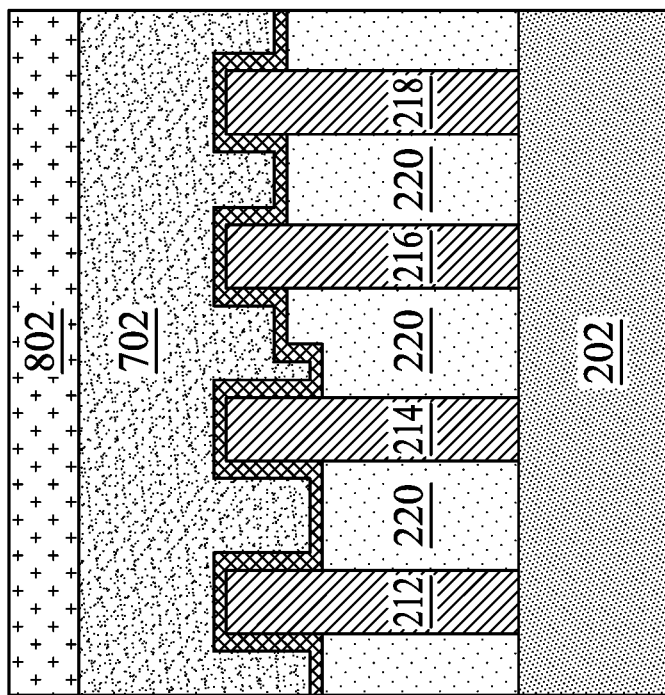
Figure 8A:
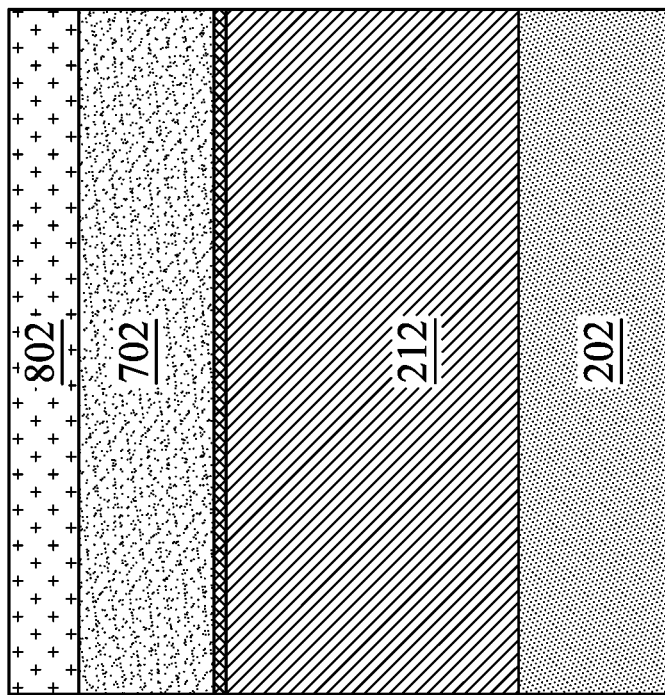

FIG. 8A and FIG. 8B illustrate cross sectional views of the semiconductor device shown in FIG. 7A and FIG. 7B after a mask layer is formed over the dummy gate electrode in accordance with various embodiments of the present disclosure. The mask layer 802 may be formed of silicon nitride or the like. The mask layer 802 may be deposited over the dummy gate electrode through suitable deposition techniques.

Figure 9B:
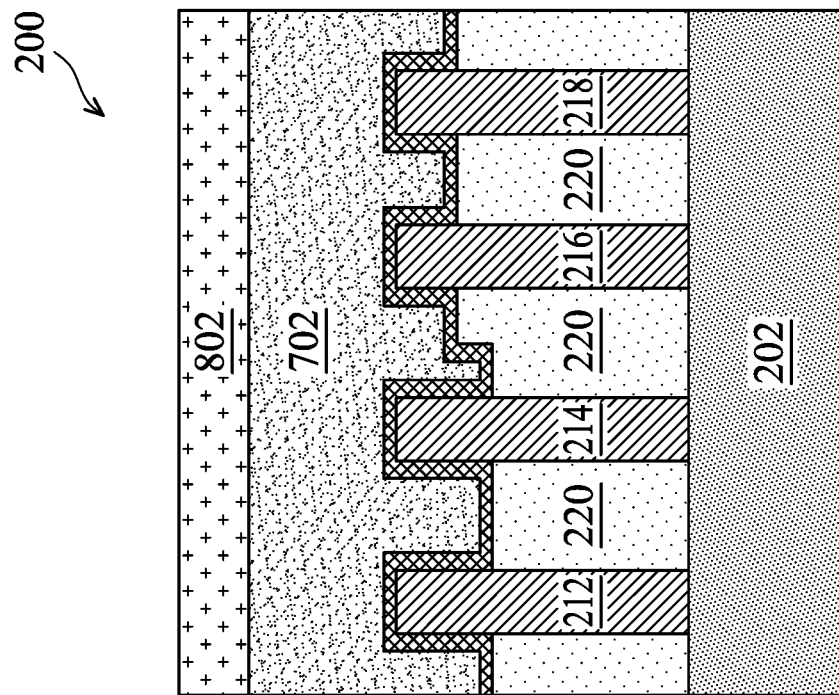
Figure 9A:
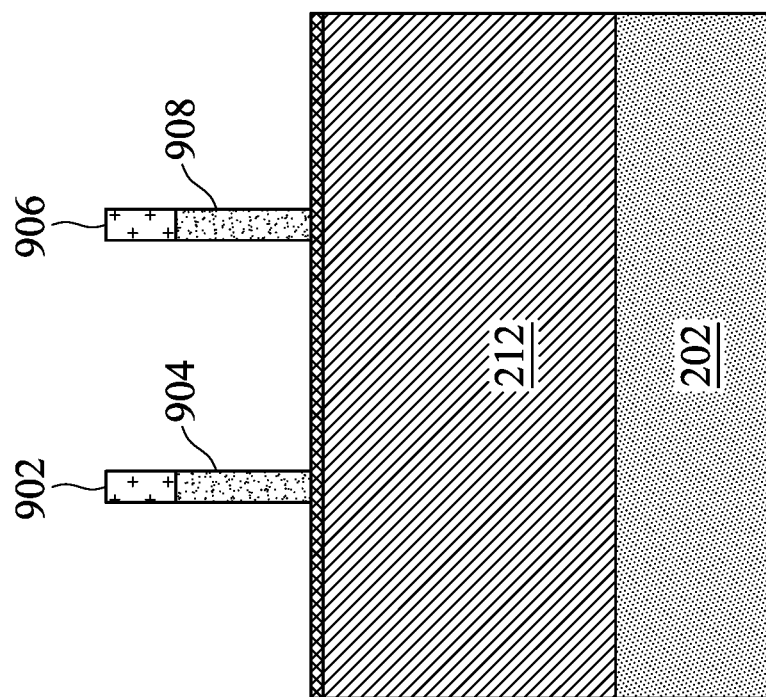

FIG. 9A and FIG. 9B illustrate cross sectional views of the semiconductor device shown in FIG. 8A and FIG. 8B after an etching process is applied to the dummy gate electrode in accordance with various embodiments of the present disclosure. A suitable photolithography and etching techniques may be employed to remove portions of the dummy gate electrode to form dummy gates 904 and 908, and masks 902 and 906 as shown in FIG. 9A.

Figure 10B:
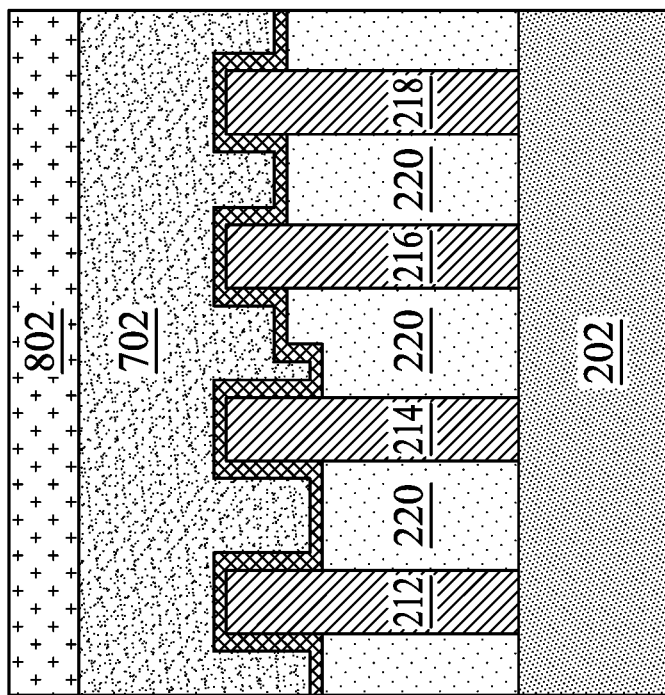
Figure 10A:
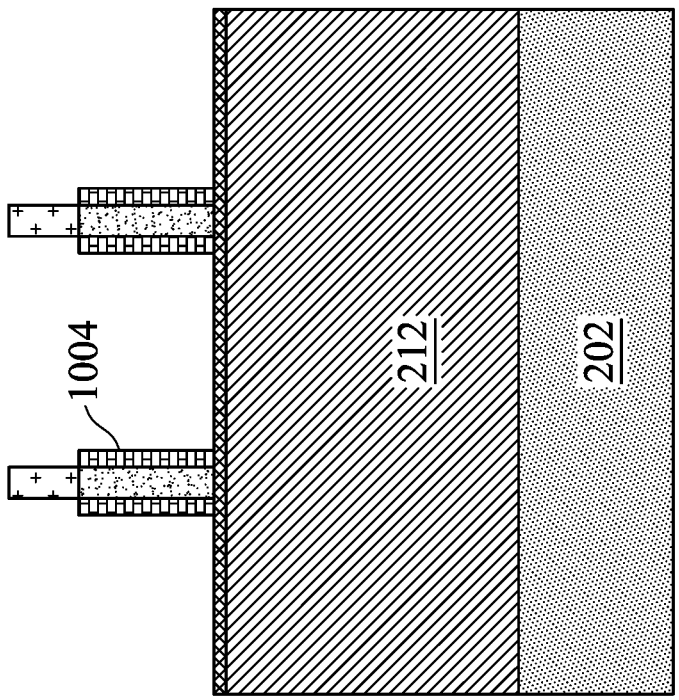

FIG. 10A and FIG. 10B illustrate cross sectional views of the semiconductor device shown in FIG. 9A and FIG. 9B after a plurality of seal spacers are formed on the sidewalls of the dummy gate electrodes in accordance with various embodiments of the present disclosure. The seal spacers 1004 may be formed of suitable dielectric material such as silicon oxide, silicon nitride, silicon oxynitride, any combinations thereof and/or the like. The seal spacers 1004 may be formed by using suitable fabrication techniques such as a thermal oxidation process and/or the like.

Figure 11B:
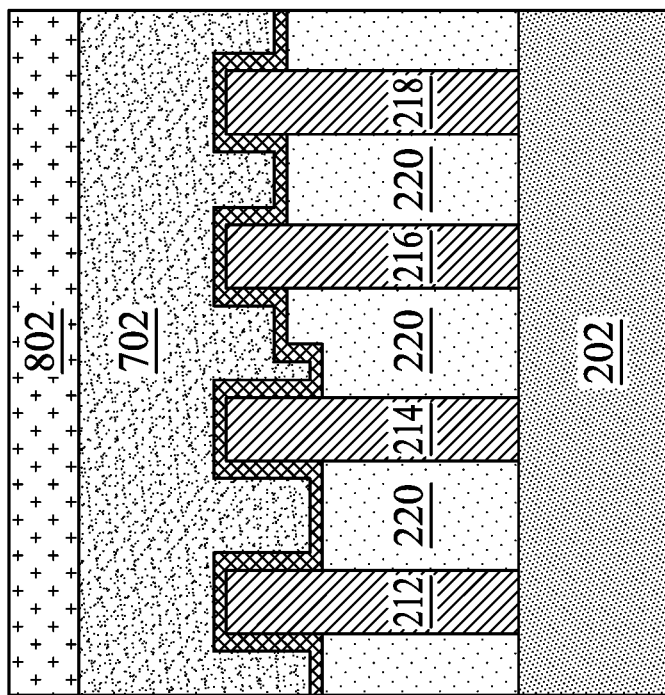
Figure 11A:
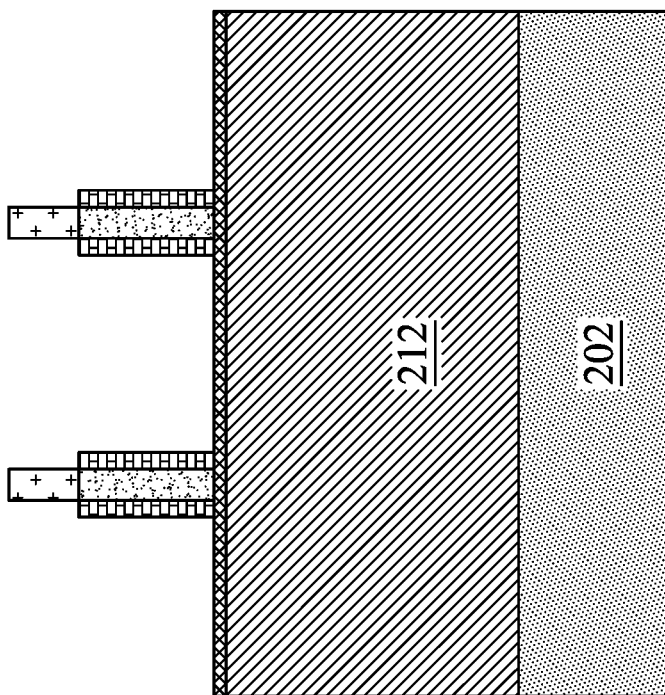

FIG. 11A and FIG. 11B illustrate cross sectional views of the semiconductor device shown in FIG. 10A and FIG. 10B after lightly doped drain/source (LDD) regions (not shown) are formed in the fins in accordance with various embodiments of the present disclosure. Similar to FIGS. 3B and 4B, a mask may be formed over the PMOS region of the semiconductor device 200 while exposing the NMOS region, and n-type dopants may be implanted into the exposed n-type fins (e.g., fin 212). The mask may be removed after the n-type implantation. Subsequently, a mask may be formed over the NMOS region of the semiconductor device 200 while exposing the PMOS region, and p-type dopants may be implanted into the exposed p-type fins (e.g., fin 216). The mask may be removed subsequently. An annealing process may be employed to increase the implantation depths of the p-type dopants and the n-type dopants.

Figure 12B:
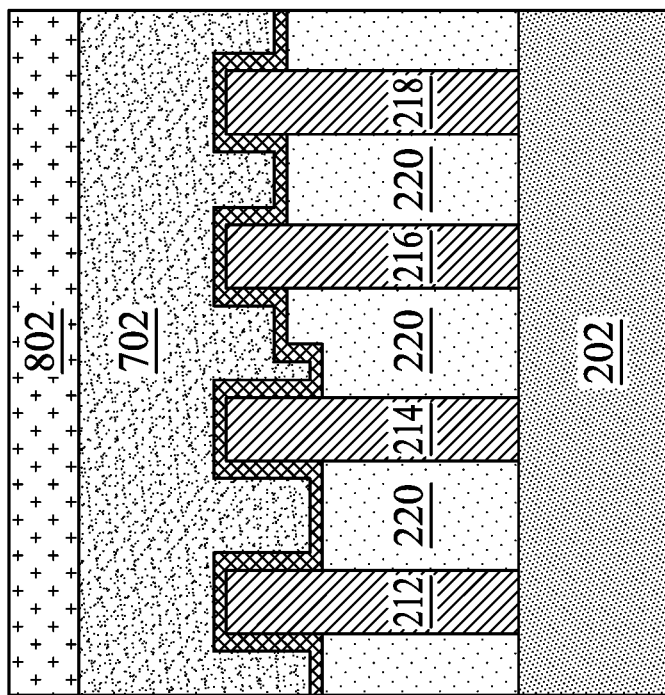
Figure 12A:
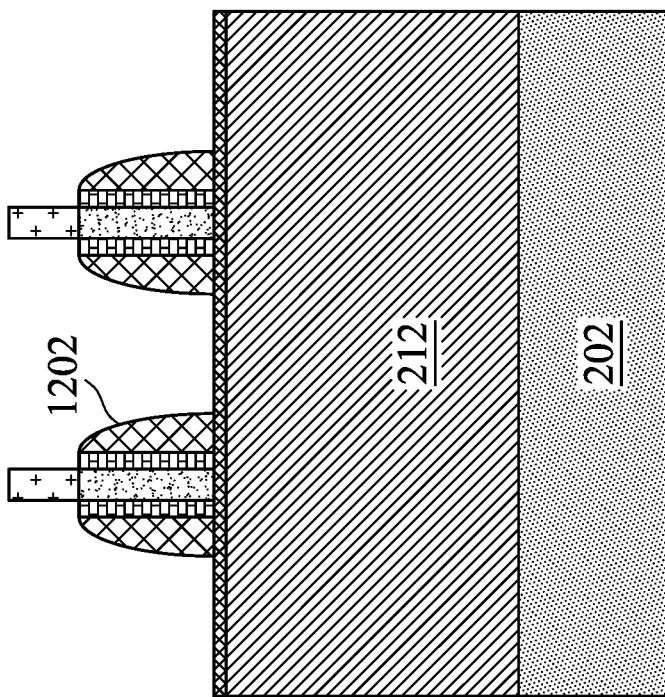

FIG. 12A and FIG. 12B illustrate cross sectional views of the semiconductor device shown in FIG. 11A and FIG. 11B after a plurality of dummy spacers are formed on the seal spacers in accordance with various embodiments of the present disclosure. The dummy spacers 1202 may be formed by suitable deposition techniques such as ALD, LPCVD, molecular layer deposition (MLD) and/or the like. A suitable etching process such as an anisotropic etching process and the like may be employed subsequently to form dummy spacers 1202 as shown in FIG. 12A. The dummy spacers 1202 may be formed of suitable dielectric materials such as silicon nitride, oxynitride, silicon carbide, oxide and/or the like.

FIG. 13A and FIG. 13B illustrate cross sectional views of the semiconductor device shown in FIG. 12A and FIG. 12B after an etching process is applied to the fins in accordance with various embodiments of the present disclosure. As shown in FIG. 13A, drain/source regions of the fins (e.g., fin 212) are etched to form recesses 1302, 1304 and 1306. The recesses 1302, 1304 and 1306 may be formed by using suitable etching processes such as a dry etching, a wet etching, or any combinations thereof.

Figure 14B:
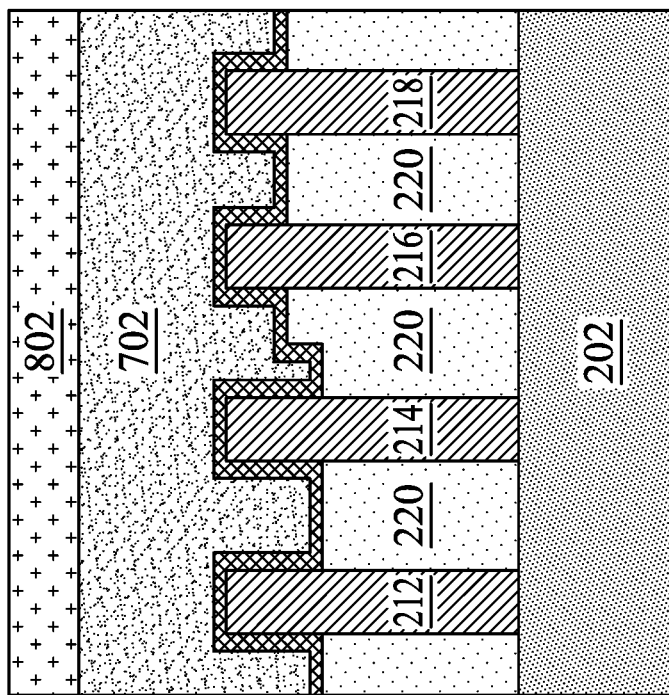
Figure 14A:
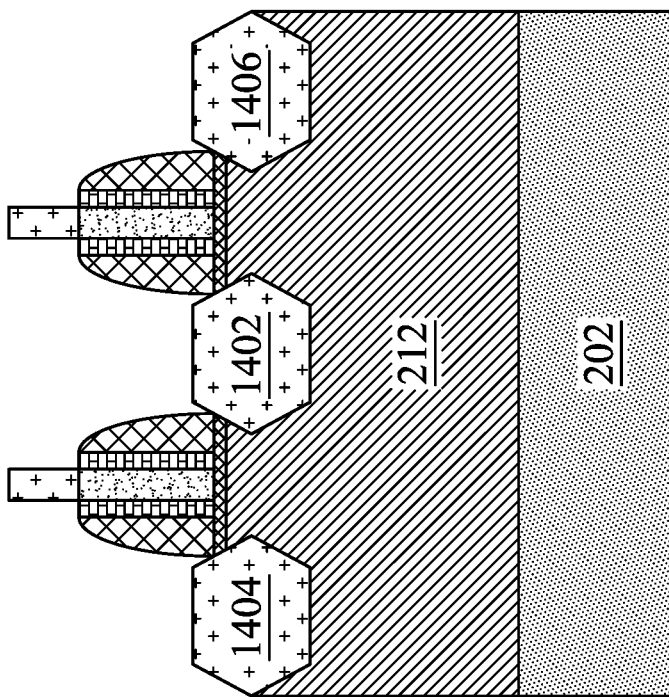

FIG. 14A and FIG. 14B illustrate cross sectional views of the semiconductor device shown in FIG. 13A and FIG. 13B after an epitaxial growth process is applied to the fins in accordance with various embodiments of the present disclosure. In some embodiments, the drain/source regions may be of strained drain/source features. The strained drain/source regions 1402, 1404 and 1406 may be epitaxially grown in the recesses 1302, 1304 and 1306. As shown in FIG. 14A, the top surfaces of the strained drain/source regions 1402, 1404 and 1406 may be over the top surface of the fin 212.

Figure 15A:
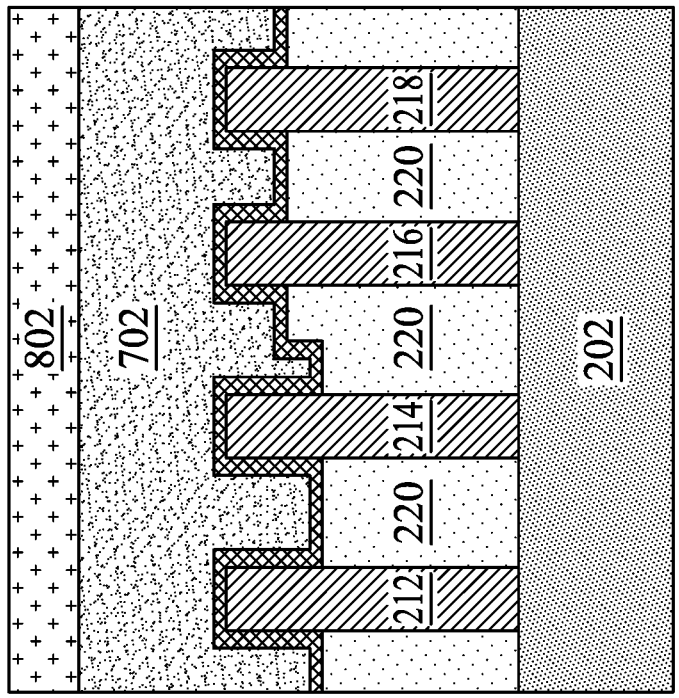
Figure 15B:
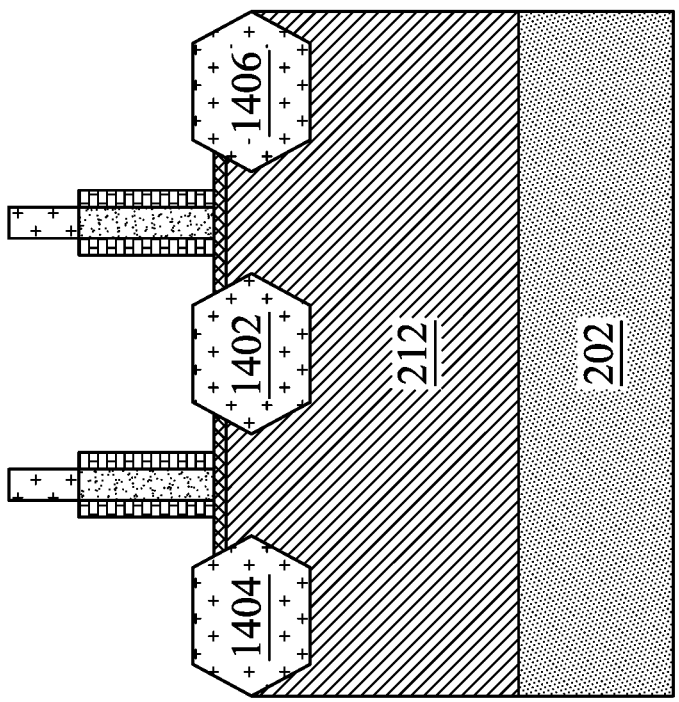

FIG. 15A and FIG. 15B illustrate cross sectional views of the semiconductor device shown in FIG. 14A and FIG. 14B after a dummy spacer removal process is applied to the dummy spacers in accordance with various embodiments of the present disclosure. As shown in FIG. 15A, the dummy gate spacers are removed by suitable etching processes such as a dry etching, a wet etching, or any combinations thereof.

Figure 16B:
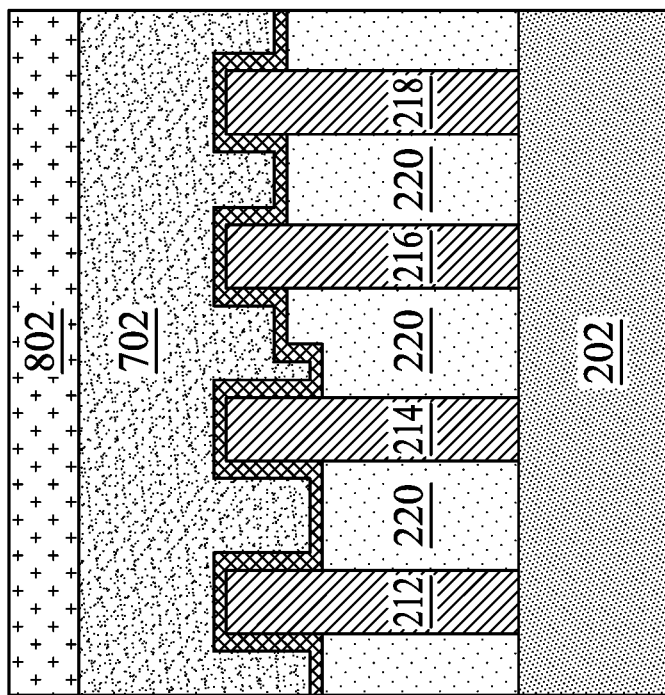
Figure 16A:
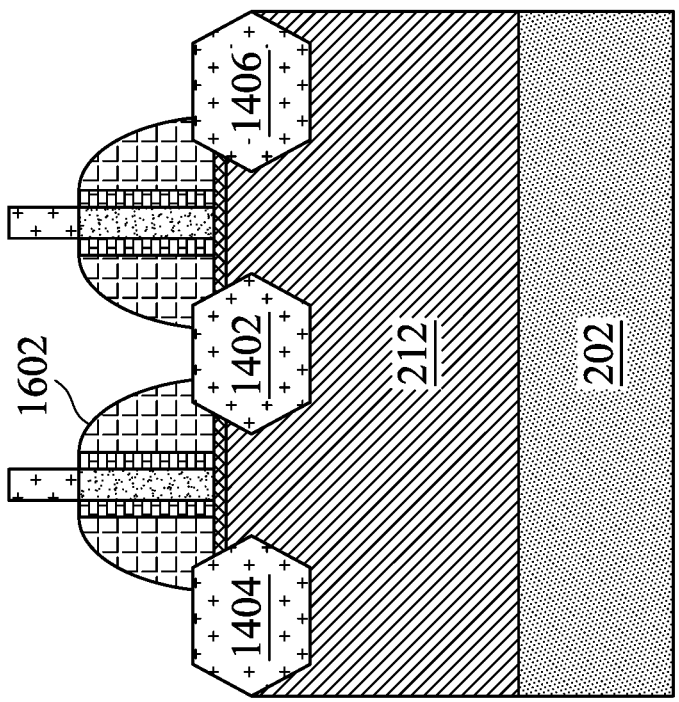

FIG. 16A and FIG. 16B illustrate cross sectional views of the semiconductor device shown in FIG. 15A and FIG. 15B after a plurality of spacers are formed on the seal spacers in accordance with various embodiments of the present disclosure. The spacer layers 1602 may be formed by blanket depositing one or more spacer layers. The spacer layers 1602 may comprise suitable dielectric materials such as silicon nitride, oxynitride, silicon carbide, oxide and/or the like.

The spacer layers 1602 may be formed by suitable deposition techniques such as ALD, LPCVD, MLD and/or the like. The spacer layers 1602 may be patterned by suitable etching processes such as an anisotropic etching process and the like, thereby removing the spacer layers to form the spacer layers 1602 as shown in FIG. 16A.

Figure 17B:
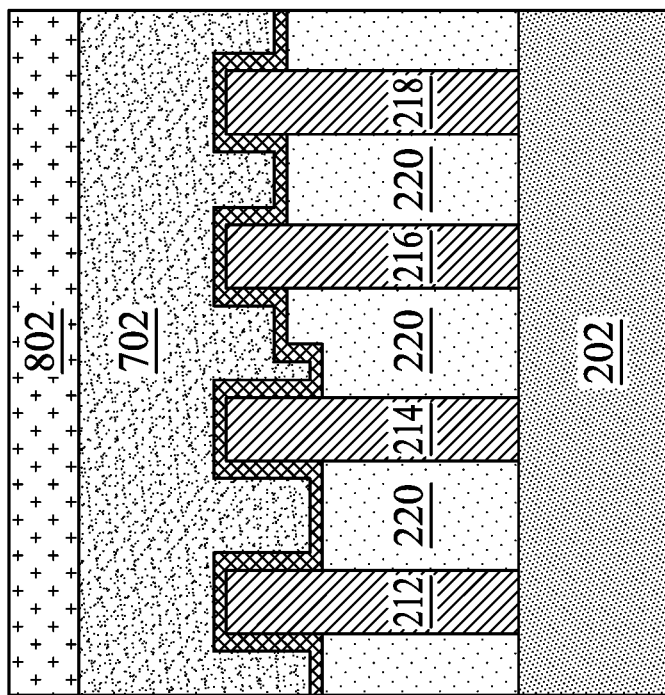
Figure 17A:
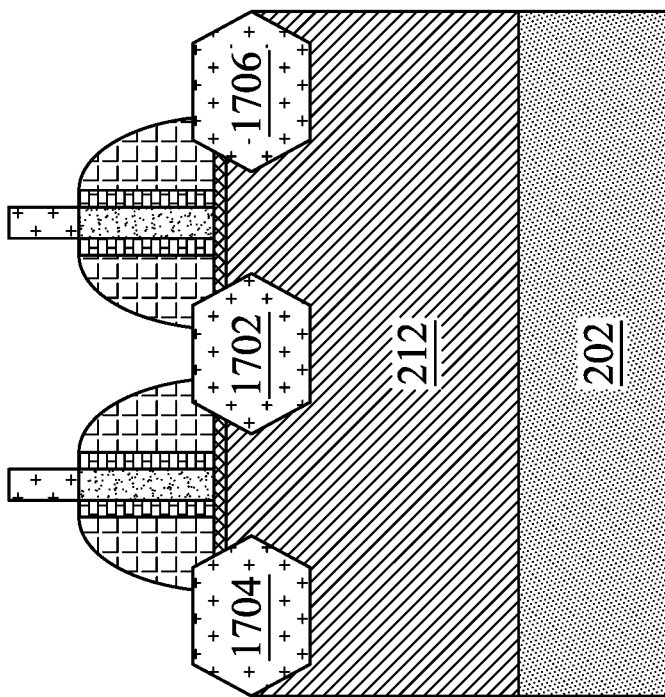

FIG. 17A and FIG. 17B illustrate cross sectional views of the semiconductor device shown in FIG. 16A and FIG. 16B after a drain/source implantation process is applied to the fins in accordance with various embodiments of the present disclosure. For PMOS portions of the semiconductor device 200, the drain/source regions such as 1706 may be formed by implanting appropriate p-type dopants such as boron, gallium, indium and/or the like. Alternatively, for NMOS portions of the semiconductor device 200, the drain/source regions such as 1704 may be formed by implanting appropriate n-type dopants such as phosphorous, arsenic and/or the like. In some embodiments, the epitaxial source/drain regions shown in FIG. 14A may be in situ doped during growth.

Figure 18B:
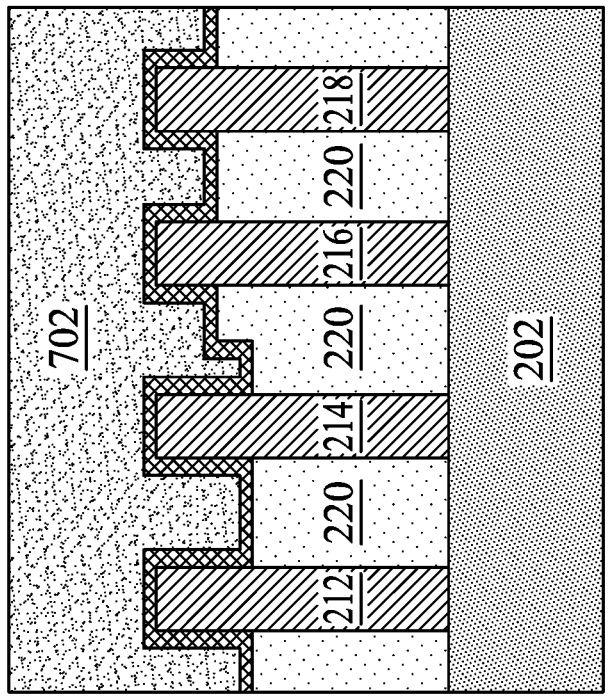
Figure 18A:
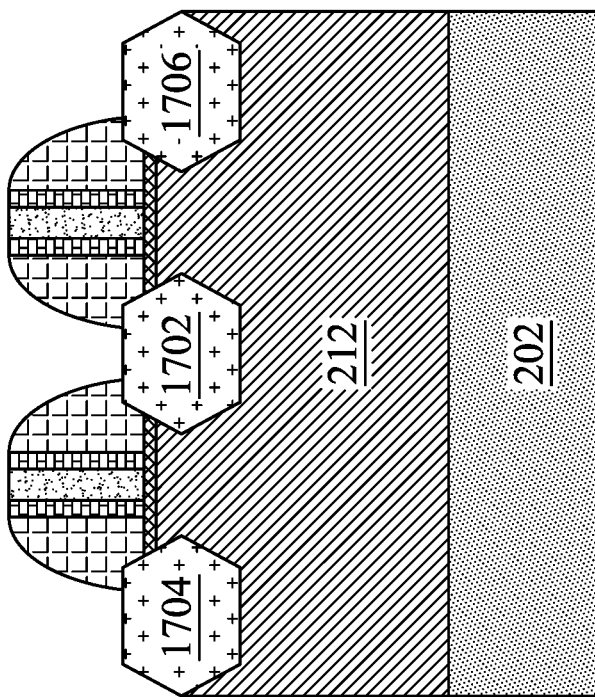

FIG. 18A and FIG. 18B illustrate cross sectional views of the semiconductor device shown in FIG. 17A and FIG. 17B after an etching process is applied to the mask layer in accordance with various embodiments of the present disclosure. The mask layer 802 shown in FIGS. 17A and 17B may be removed by suitable etching techniques such as an etching process selective to the material of the mask layer 802.

Figure 19B:
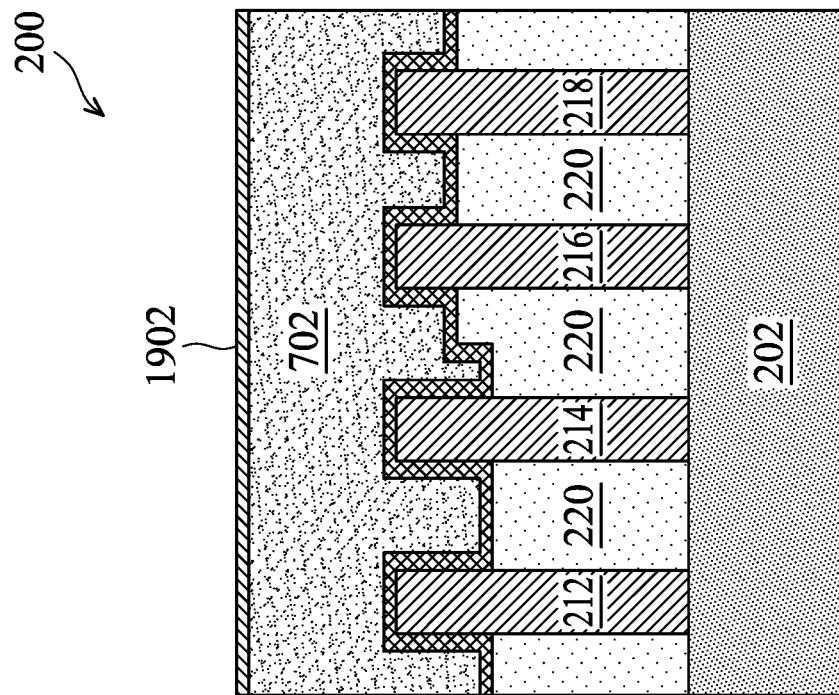
Figure 19A:
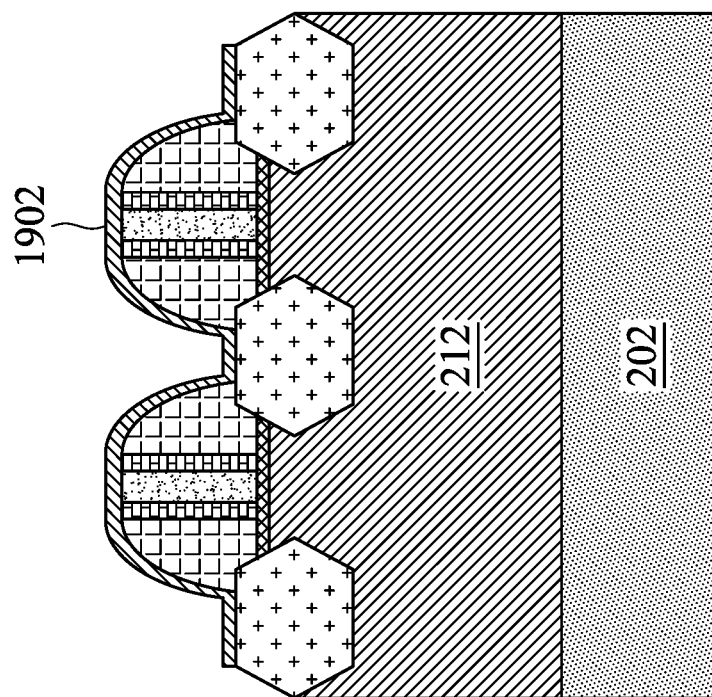

FIG. 19A and FIG. 19B illustrate cross sectional views of the semiconductor device shown in FIG. 18A and FIG. 18B after a contact etch stop layer is deposited over the semiconductor device in accordance with various embodiments of the present disclosure. The contact etch stop layer 1902 may be formed in order to provide a control point for subsequent etch processes. The contact etch stop layer 1902 may be a dielectric material such as silicon nitride, although other materials known in the art, such as oxide, could also be used. In some embodiments, the contact etch stop layer 1902 may be formed using a process such as CVD, PECVD, ALD, or the like.

Figure 20B:
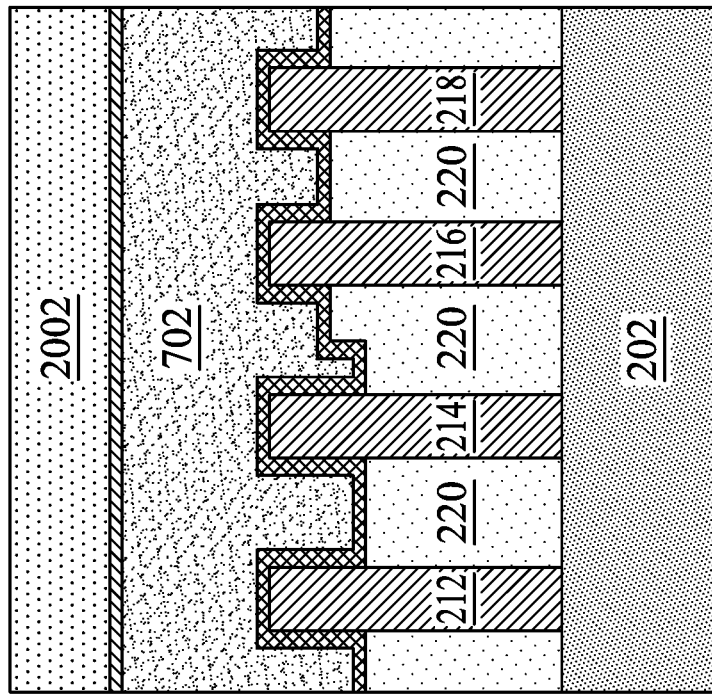
Figure 20A:
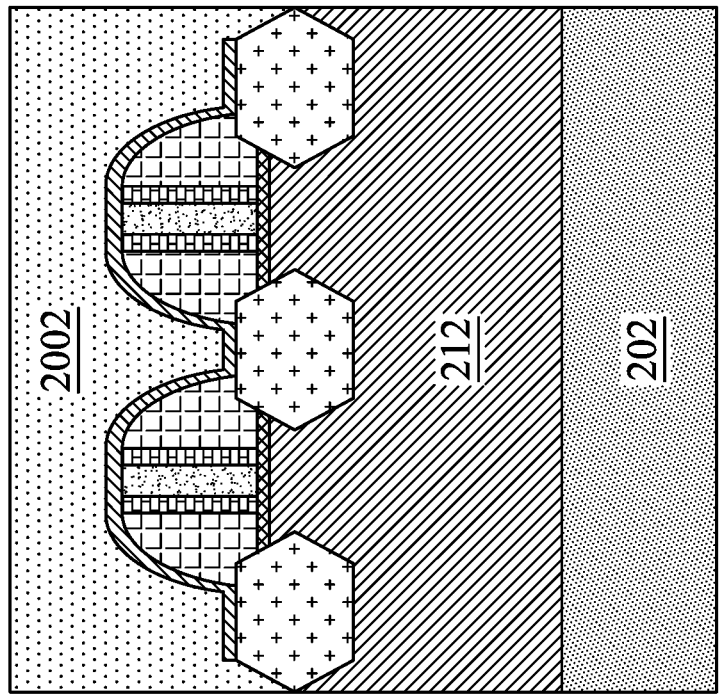

FIG. 20A and FIG. 20B illustrate cross sectional views of the semiconductor device shown in FIG. 19A and FIG. 19B after an inter-layer dielectric (ILD) layer is deposited over the contact etch stop layer in accordance with various embodiments of the present disclosure. The ILD layer 2002 may be formed by CVD, sputtering, or any other methods known and used in the art for forming an ILD layer.

The ILD layer 2002 may be about 4,000 Angstroms to about 13,000 Angstroms in thickness, but other thicknesses may be used. The ILD layer 2002 may comprise doped or undoped silicon oxide, although other materials such as silicon nitride doped silicate glass, high-k materials, combinations of these, or the like, may alternatively be utilized.

FIG. 21A and FIG. 21B illustrate cross sectional views of the semiconductor device shown in FIG. 20A and FIG. 20B after a CMP process is applied to the semiconductor device in accordance with various embodiments of the present disclosure. The excess dielectric materials of the ILD layer 2002 may be removed by using suitable removal techniques such as grinding, polishing and/or chemical etching, a combination of etching and grinding techniques and the like.

In accordance with some embodiments, the removal process may be implemented by using a CMP process. In the CMP process, a combination of etching materials and abrading materials are put into contact with the top surface of the ILD layer 2002 and a grinding pad (not shown) is used to grind away the excess materials until the top surfaces of the gate electrodes are exposed.

Figure 22B:
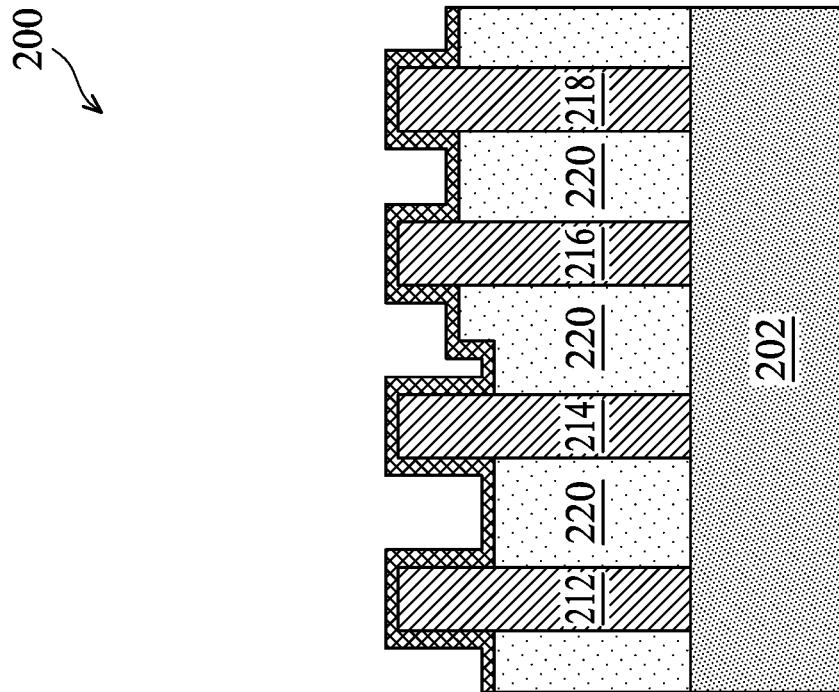
Figure 22A:
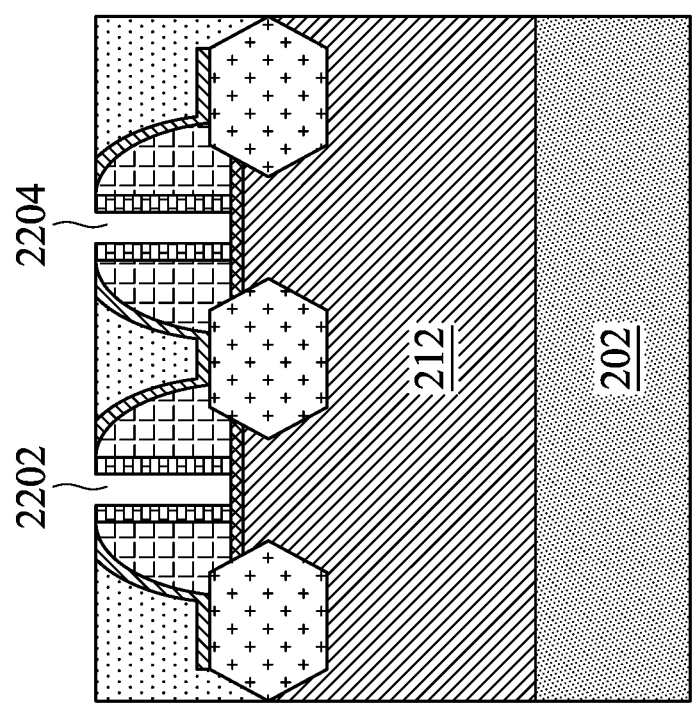

FIG. 22A and FIG. 22B illustrate cross sectional views of the semiconductor device shown in FIG. 21A and FIG. 21B after a dummy gate removal process is applied to the semiconductor device in accordance with various embodiments of the present disclosure. The dummy gates shown in FIG. 21A are removed by suitable etching processes. As a result, openings 2202 and 2204 are formed. It should be noted that during the dummy gate removal process, the dummy gate dielectric layer formed between the dummy gates and the fin may be used as an etch stop layer.

Figure 23B:
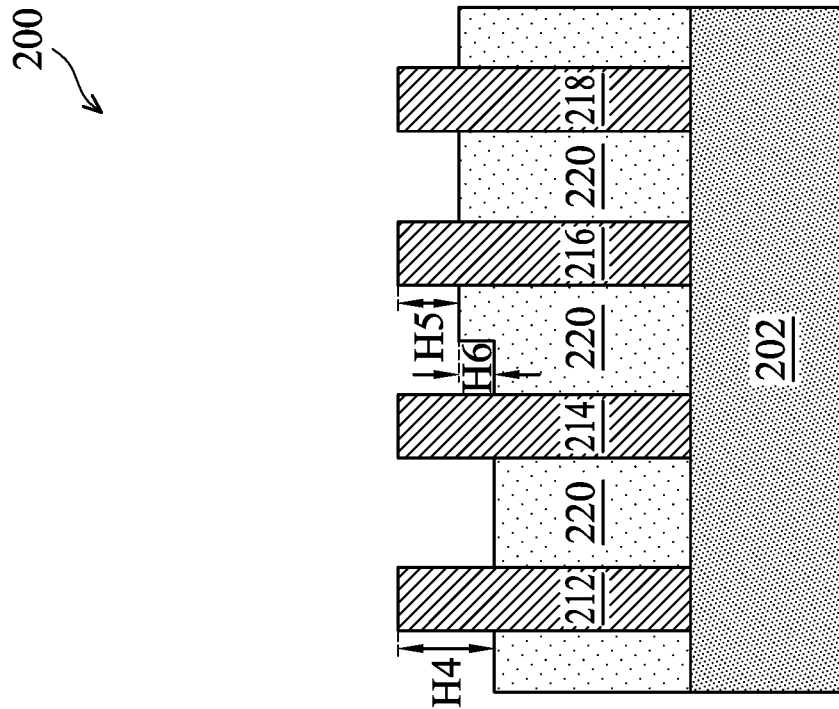
Figure 23A:
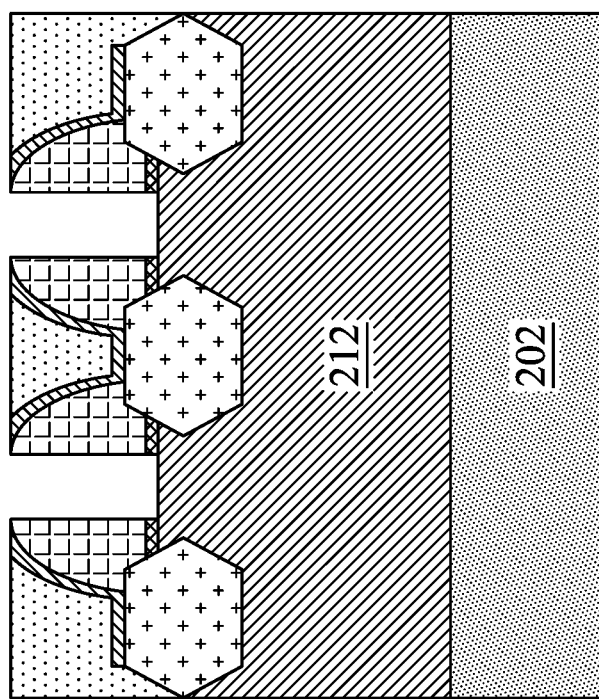

FIG. 23A and FIG. 23B illustrate cross sectional views of the semiconductor device shown in FIG. 22A and FIG. 22B after another etching process is applied to the semiconductor device in accordance with various embodiments of the present disclosure. The dummy gate dielectric layer may be removed by suitable etching processes such as a dry etching process, a wet etching process and any combinations thereof.

Once the dummy gate dielectric layer has been removed as shown in FIG. 23A and FIG. 23B, the exposed portions of fins 212, 214, 216 and 218 may be of different heights in comparison with the heights shown in FIG. 5B. The height difference results from the etching processes after the fabrication step shown in FIG. 5B.

As shown in FIG. 23B, the height of the fins of NMOS transistors (e.g., fin 212) is defined as H4. The height of the fins of PMOS transistors (e.g., fin 216) is defined as H5. The difference between H4 and H5 is defined as H6. In some embodiments, H6 is greater than H3 shown in FIG. 5B.

Figure 24B:
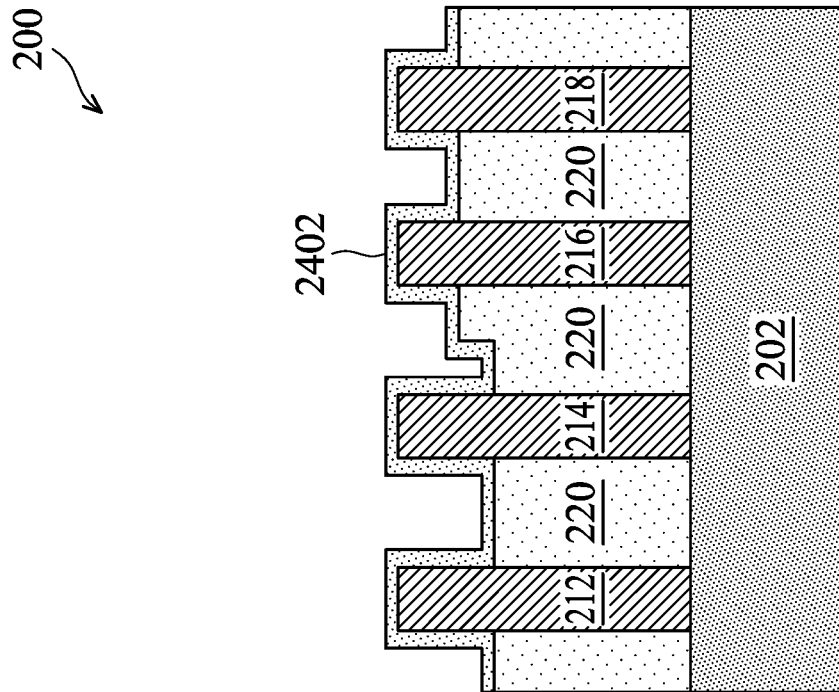
Figure 24A:
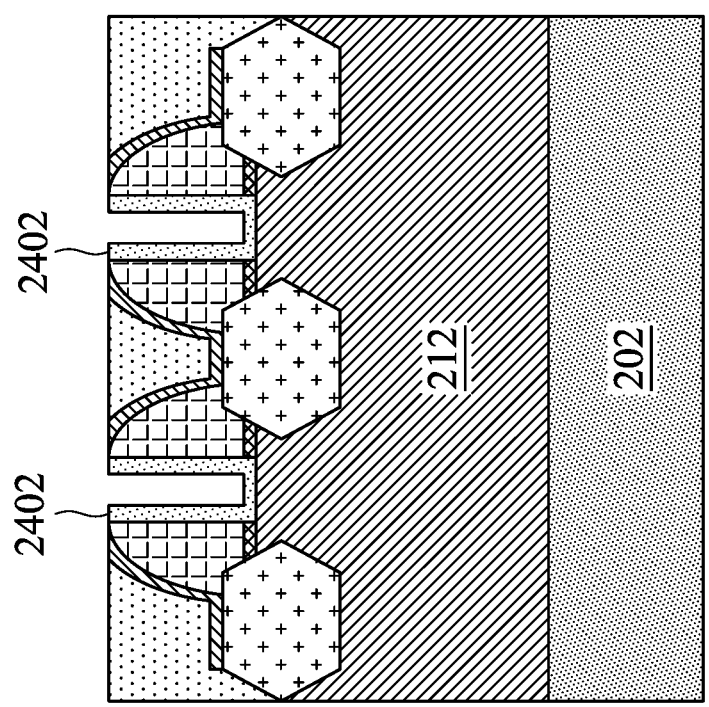

FIG. 24A and FIG. 24B illustrate cross sectional views of the semiconductor device shown in FIG. 23A and FIG. 23B after a gate dielectric layer is deposited in the openings in accordance with various embodiments of the present disclosure. The gate dielectric layer 2402 is deposited conformally in the openings 2202 and 2204. The gate dielectric layer 2402 may be a dielectric material such as silicon oxide, silicon oxynitride, silicon nitride, an oxide, a nitrogen-containing oxide, a combination thereof and/or the like.

The gate dielectric layer 2402 may have a relative permittivity value greater than about 4. Other examples of such materials include aluminum oxide, lanthanum oxide, hafnium oxide, zirconium oxide, hafnium oxynitride, combinations thereof and/or the like. In an embodiment in which the gate dielectric layer 2402 comprises an oxide layer, the gate dielectric layer 2402 may be formed by a thermal process using steam as a precursor or by a wet process using 03 as a precursor.

Figure 25B:
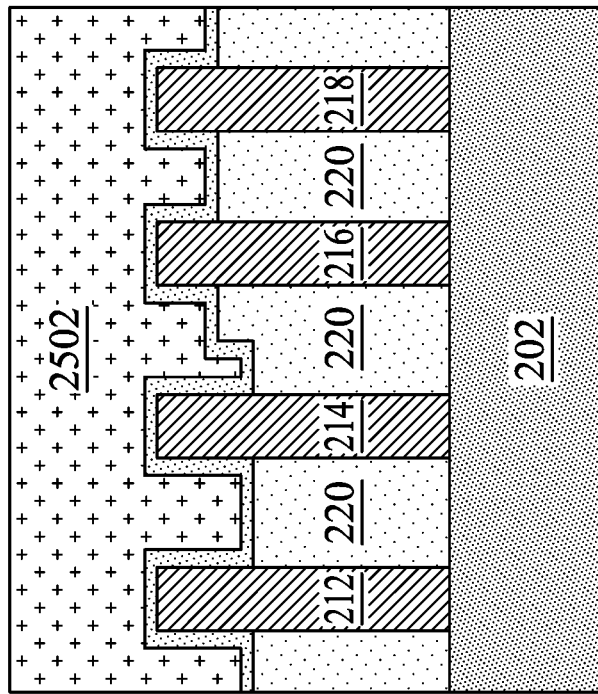
Figure 25A:
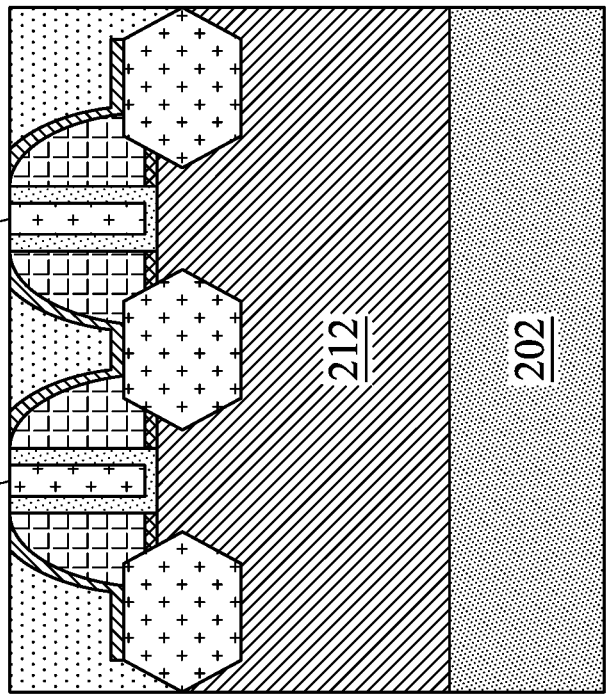

FIG. 25A and FIG. 25B illustrate cross sectional views of the semiconductor device shown in FIG. 24A and FIG. 24B after a gate electrode layer is formed over the gate dielectric layer in accordance with various embodiments of the present disclosure. The gate electrode layer 2502 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped polycrystalline silicon, other conductive materials, combinations thereof and/or the like. After the gate electrode layer 2502 is filled the openings shown in FIG. 24A, a CMP process may be performed to remove the excess portions of the material of the gate electrode layer 2502.

Figure 26:
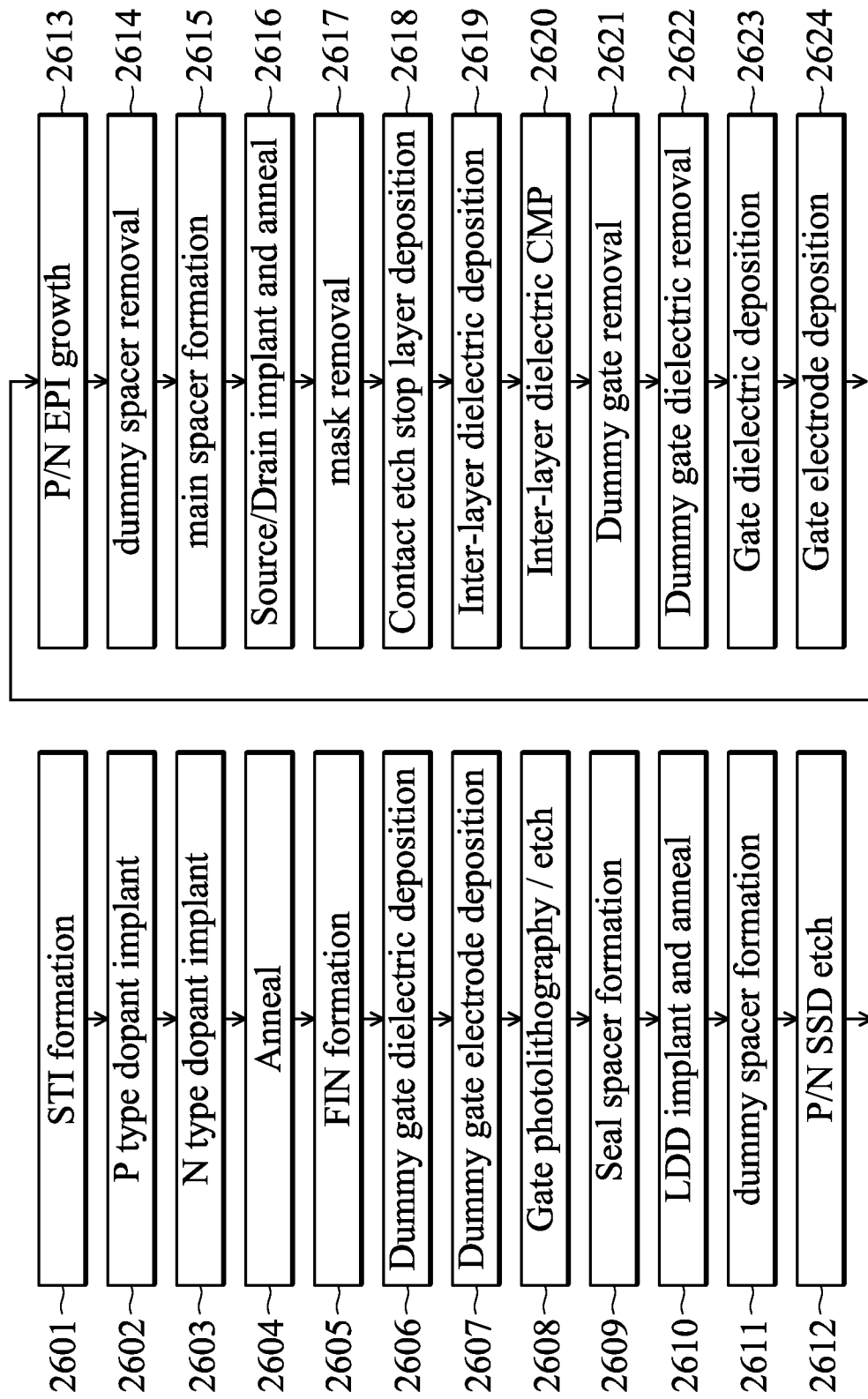
FIG. 26 is a process flow of the fabrication steps shown in FIGS. 2A-25B.

FIG. 26 is a process flow of the fabrication steps shown in FIGS. 2A-25B. At step 2601, isolation regions such as STI regions are formed in a FinFET semiconductor device. The formation of the STI regions is discussed in detail with respect to FIG. 2B. At step 2602, a p-type dopant implantation is applied to the NMOS portion of the FinFET semiconductor device. The p-type implantation process is discussed in detail with respect to FIG. 3B. At step 2603, an n-type dopant implantation is applied to the PMOS portion of the FinFET semiconductor device. The n-type implantation process is discussed in detail with respect to FIG. 4B.

At step 2604, an annealing process is employed to increase the implantation depth of the p-type dopants and the n-type dopants. At step 2605, the fins of the FinFET semiconductor device are formed through recessing the isolation regions. The isolation region recess process is illustrated in FIG. 5B. At step 2606, a dummy gate dielectric layer is deposited as shown in FIGS. 6A and 6B. At step 2607, a dummy gate electrode layer is deposited over the dummy gate dielectric layer as shown in FIGS. 7A and 7B.

At step 2608, a gate photolithography process is employed to form the dummy gate structure as shown in FIG. 9A. At step 2609, a plurality of seal spacers are formed as shown in FIG. 10A. At step 2610, light doped drain/source (LDD) regions are formed through implantation, diffusion and/or annealing processes as shown in FIG. 11A. At step 2611, dummy spacers are disposed on the seal spacers as shown in FIG. 12A. At step 2612, as shown in FIG. 13, an etching process is employed to form a plurality of recesses for strained drain/source features.

At step 2613, the strained source/drain (SSD) features are formed through suitable processes such as an epitaxial process as shown in FIG. 14A. At step 2614, as shown in FIG. 15A, dummy spacers are removed by using suitable techniques. At step 2615, gate spacers are disposed on the sidewalls of dummy gate electrodes as shown in FIG. 16A. At step 2616, drain/source regions are formed through implantation, diffusion and/or annealing processes as shown in FIG. 17A.

At step 2617, the mask layer formed over the dummy gate electrode has been removed as shown in FIGS. 18A and 18B. At step 2618, a contact etch stop layer (CESL) is formed over the semiconductor device as shown in FIGS. 19A and 19B. At step 2619, an inter-layer dielectric (ILD) layer is formed over the CESL layer as shown in FIGS. 20A and 20B. At step 2620, a CMP process is applied to excess portions of the ILD layer as shown in FIGS. 21A and 21B.

At step 2621, the dummy gate electrode is removed as shown in FIGS. 22A and 22B. At step 2622, the dummy gate dielectric layer is removed through an etching process as shown in FIGS. 23A and 23B. At step 2623, a gate dielectric layer is deposited as shown in FIG. 24A and FIG. 24B. At step 2624, a gate electrode layer is deposited over the gate dielectric layer as shown in FIGS. 25A and 25B.

In accordance with an embodiment, a method comprises depositing a first photoresist layer to cover a p-type region over a substrate, wherein a first fin and a second fin over the substrate and embedded in isolation regions, applying a first implantation process to first isolation regions in an n-type region over the substrate, depositing a second photoresist layer to cover the n-type region over the substrate, applying a second implantation process to second isolation regions in the p-type region over the substrate, applying an annealing process to the isolation regions and recessing isolation regions to expose an upper portion of the first fin and an upper portion of the second fin, wherein the first fin is in the n-type region, the second fin is in the p-type region, the upper portion of the first fin is of a first height and the upper portion of the second fin is of a second height, and wherein the first height is greater than the second height.

In accordance with an embodiment, a method comprises forming a plurality of isolation regions in a substrate, wherein a first fin is surrounded by a first isolation region and a second fin is surrounded by a second isolation region, applying a first ion implantation process to the first isolation region, wherein dopants with a first polarity type are implanted in the first isolation region, applying a second ion implantation process to the second isolation region, wherein dopants with a second polarity type are implanted in the second isolation region, applying an anneal process to doped isolation regions and applying an etching process to the first isolation region and the second isolation region to form a first portion and a second portion of the first fin, and a first portion and a second portion of the second fin, wherein the first portion of the first fin is over a top surface of the first isolation region and the first portion of the second fin is over a top surface of the second isolation region, and wherein a height of the first portion of the first fin is not equal to a height of the first portion of the second fin, and wherein a height difference between the first portion of the first fin and the first portion of the second fin is formed in the etching process as a result of applying different ion implantation processes to the isolation regions.

In accordance with an embodiment, a method comprises forming a plurality of first fins and a plurality of second fins over a substrate and embedded in isolation regions, wherein the first fins are in an n-type region over the substrate and surrounded by first isolation regions and the second fins are in a p-type region over the substrate and surrounded by second isolation regions, depositing a first photoresist layer over the substrate, removing the first photoresist layer over the n-type region, applying a first ion implantation process to the first isolation regions, wherein dopants with a first polarity type are implanted in the first isolation regions, depositing a second photoresist layer over the substrate, removing the second photoresist layer over the p-type region, applying a second ion implantation process to the second isolation regions, wherein dopants with a second polarity type are implanted in the second isolation regions, applying an annealing process to the isolation regions and recessing the first isolation regions and the second isolation regions through an etching process.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a first fin and a second fin over a substrate;
    a first isolation region between the first fin and the second fin, the first isolation region comprising:
        a first material extending from the first fin to the second fin;
        a first concentration of a first type of dopants within the first material;
        a second concentration of a second type of dopants different from the first type of dopants, the second type of dopants being within the first material; and
        an interface between the first concentration of the first type of dopants and the second concentration of the second type of dopants;
    a step on a top surface of the first isolation region, a sidewall of the step being located directly over the interface, wherein an upper portion of the first fin is of a first height, and wherein an upper portion of the second fin is of a second height, and wherein the first height is greater than the second height, wherein the second height is measured from a top surface of the second fin to a top surface of the first isolation region.

2. The semiconductor device of claim 1, wherein a difference between the first height and the second height is greater than or equal to about 2 nm.

3. The semiconductor device of claim 1, wherein the first fin is part of an NMOS transistor.

4. The semiconductor device of claim 3, wherein the second fin is part of a PMOS transistor.

5. The semiconductor device of claim 1, wherein the first concentration is equal to or less than $10^{18}$ cm$^{-3}$.

6. The semiconductor device of claim 5, wherein the second concentration is equal to or less than $10^{18}$ cm$^{-3}$.

7. The semiconductor device of claim 1, further comprising:
    a source/drain region; and
    a spacer located at least partially over the source/drain region.

8. A semiconductor device comprising:
    a plurality of isolation regions in a substrate:
    a first fin surrounded by a first isolation region; and
    a second fin surrounded by a second isolation region;
    a first ion implantation region within the first isolation region, the first ion implantation region comprising dopants with a first polarity type;
    a second ion implantation region within the second isolation region, wherein the second ion implantation region comprises dopants with a second polarity type different from the first polarity type;
    a step within a top surface of one of the plurality of isolation regions between the first fin and the second fin, the step having a sidewall that is located over an interface between the first ion implantation region and the second ion implantation region, wherein the top surface extends from the first fin to the second fin, wherein a first portion of the first fin extends from a top surface of the first isolation region to a top surface of the first fin, and a first portion of the second fin is over a top surface of the second isolation region, and wherein a height of the first portion of the first fin is greater than a height of the first portion of the second fin, the first fin being in an n-type region and the second fin being in a p-type region, the first ion implantation region being on a first side of the step and the second ion implantation region being located on a second side of the step opposite the first side.

9. The semiconductor device of claim 8, wherein the height difference is greater than or equal to 2 nm.

10. The semiconductor device of claim 8, wherein the dopants with the first polarity type have a first concentration within the first isolation region of equal to or less than $10^{18}$ cm$^{-3}$.

11. The semiconductor device of claim 8, wherein the dopants with the second polarity type have a second concentration within the second isolation region of equal to or less than $10^{18}$ cm$^{-3}$.

12. The semiconductor device of claim 8, further comprising:
    an epitaxial first source/drain region adjacent to the first fin; and
    a spacer located at least partially over the epitaxial first source/drain region.

13. The semiconductor device of claim 8, wherein the first ion implantation region has a first etching rate for a first etchant of about 34.7 Angstroms per minute.

14. The semiconductor device of claim 13, wherein the second ion implantation region has a second etching rate for the first etchant of about 52.8 Angstroms per minute.

15. A semiconductor device comprising:
    a plurality of first fins and a plurality of second fins over a substrate and embedded in isolation regions, wherein:
        the first fins are in an n-type region over the substrate and surrounded by first isolation regions; and
        the second fins are in a p-type region over the substrate and surrounded by second isolation regions;
    a first ion implantation region within the first isolation regions, wherein dopants with a first polarity type are located in the first ion implantation region;
    a second ion implantation region within the second isolation regions, wherein dopants with a second polarity type are located within the second ion implantation region, wherein an interface is located between the first ion implantation region and the second ion implantation region;
    a single step on a top surface of an isolation region between the n-type region and the p-type region, wherein the step is located directly over the interface and wherein the first fins extend away from the first isolation regions further than the second fins extend away from the second isolation regions.

16. The semiconductor device of claim 15, wherein the dopants with the first polarity type have a concentration within the first ion implantation region of equal to or less than $10^{18}$ cm$^{-3}$.

17. The semiconductor device of claim 15, wherein the dopants with the second polarity type have a concentration within the second ion implantation region of equal to or less than $10^{18}$ cm$^{-3}$.

18. The semiconductor device of claim 15, further comprising:
    a source/drain region adjacent to one of the first fins, the source/drain region extending beyond a top surface of the one of the first fins; and
    a first spacer extending at least partially over the source/drain region.

19. The semiconductor device of claim 15, wherein the first ion implantation region has a first etching rate for a first etchant of about 34.7 Angstroms per minute.

20. The semiconductor device of claim 19, wherein the second ion implantation region has a second etching rate for the first etchant of about 52.8 Angstroms per minute.

* * * * *